(12) United States Patent
Chang et al.

(10) Patent No.: US 11,114,543 B2
(45) Date of Patent: Sep. 7, 2021

(54) GROUP III-V DEVICE STRUCTURE

(71) Applicant: Taiwan Semiconductor Manufacturing Co., Ltd., Hsinchu (TW)

(72) Inventors: Ming-Hong Chang, Hsinchu (TW); Chih-Yuan Chan, Kaohsiung (TW); Shen-Ping Wang, Keelung (TW); Chung-Cheng Chen, Toufen (TW); Chien-Li Kuo, Hsinchu (TW); Po-Tao Chu, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 29 days.

(21) Appl. No.: 15/460,582

(22) Filed: Mar. 16, 2017

(65) Prior Publication Data

US 2018/0212047 A1 Jul. 26, 2018

Related U.S. Application Data

(60) Provisional application No. 62/449,754, filed on Jan. 24, 2017.

(51) Int. Cl.
*H01L 29/417* (2006.01)
*H01L 29/78* (2006.01)
(Continued)

(52) U.S. Cl.
CPC ...... *H01L 29/66462* (2013.01); *H01L 21/743* (2013.01); *H01L 21/76898* (2013.01);
(Continued)

(58) Field of Classification Search
CPC ........... H01L 29/66462; H01L 29/7786; H01L 23/481; H01L 23/522; H01L 29/41766;
(Continued)

(56) References Cited

U.S. PATENT DOCUMENTS

| 2009/0121775 A1* | 5/2009 | Ueda ................... H01L 29/1066 327/427 |
| 2012/0153300 A1* | 6/2012 | Lidow .................. H01L 29/1075 257/77 |

(Continued)

FOREIGN PATENT DOCUMENTS

| WO | WO-2016017127 A1 * | 2/2016 | ........... H01L 29/808 |
| WO | WO-2017051530 A1 * | 3/2017 | ........... H01L 29/778 |

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

A group III-V device structure is provided. The group III-V device structure includes a channel layer formed over a substrate and an active layer formed over the channel layer. The group III-V device structure also includes a gate structure formed over the active layer and a source electrode and a drain electrode formed over the active layer. The source electrode and the drain electrode are formed on opposite sides of the gate structure. The group III-V device structure further includes a through via structure formed through the channel layer, the active layer and a portion of the substrate, and the through via structure is electrically connected to the source electrode or the drain electrode.

19 Claims, 29 Drawing Sheets

(51) Int. Cl.
  *H01L 29/66* (2006.01)
  *H01L 29/10* (2006.01)
  *H01L 29/778* (2006.01)
  *H01L 21/768* (2006.01)
  *H01L 21/74* (2006.01)
  *H01L 29/423* (2006.01)
  *H01L 23/31* (2006.01)
  *H01L 23/532* (2006.01)
  *H01L 23/522* (2006.01)
  *H01L 29/20* (2006.01)

(52) U.S. Cl.
  CPC ...... *H01L 29/1066* (2013.01); *H01L 29/7786* (2013.01); *H01L 23/3171* (2013.01); *H01L 23/522* (2013.01); *H01L 23/53223* (2013.01); *H01L 23/53238* (2013.01); *H01L 29/2003* (2013.01); *H01L 29/42376* (2013.01)

(58) Field of Classification Search
  CPC ............ H01L 29/4175; H01L 29/1066; H01L 29/7787; H01L 29/66431; H01L 29/2003; H01L 21/76898; H01L 21/743
  See application file for complete search history.

(56) References Cited

U.S. PATENT DOCUMENTS

| | | | |
|---|---|---|---|
| 2012/0153355 A1* | 6/2012 | Umeda | H01L 29/2003 257/192 |
| 2012/0193637 A1* | 8/2012 | Kalnitsky | H01L 21/0262 257/76 |
| 2013/0015498 A1* | 1/2013 | Briere | H01L 29/41766 257/191 |
| 2014/0239346 A1* | 8/2014 | Green | H01L 27/0629 257/192 |
| 2015/0028345 A1* | 1/2015 | Wong | H01L 29/7787 257/76 |
| 2015/0318387 A1* | 11/2015 | Chiu | H01L 29/2003 257/76 |
| 2016/0141404 A1* | 5/2016 | Tsai | H01L 29/7787 257/76 |
| 2016/0268409 A1* | 9/2016 | Ogawa | H01L 29/66462 |
| 2017/0104064 A1* | 4/2017 | Aoki | H01L 29/7786 |

\* cited by examiner

GROUP III-V DEVICE STRUCTURE

CROSS REFERENCE TO RELATED APPLICATIONS

This Application claims the benefit of U.S. Provisional Application No. 62/449,754, filed on Jan. 24, 2017, and entitled "Group III-V device structure", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A Group III-Group V (or III-V) device structure has a number of attractive properties including high electron mobility and the ability to transmit signals at high frequencies.

Although existing Group III-Group V (or III-V) device structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dime ns of the various features may be arbitrarily increased or reduced for clarity of discussion.

FIG. 3K' shows a cross-sectional representation of a modified embodiment of the group III-V device structure.

FIG. 5F' shows a cross-sectional representation of a modified embodiment of the group III-V device structure

DETAILED DESCRIPTION

Figure 1A:
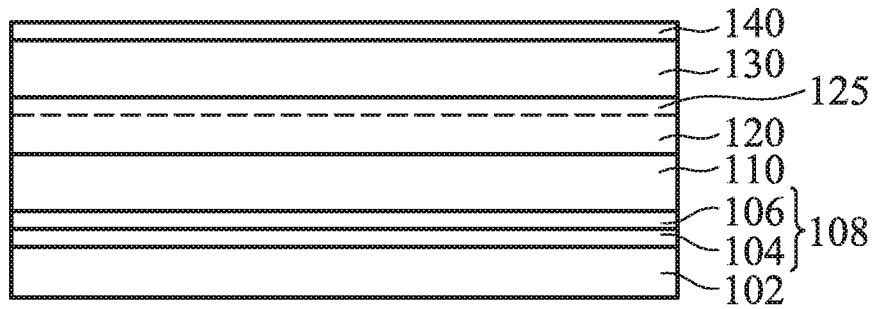
FIGS. 1A-1L show cross-sectional representations of various stages of forming a group III-V device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1L show cross-sectional representations of various stages of forming a group III-V device structure 100, in accordance with some embodiments of the disclosure. The group device structure 100 is a field effect transistor incorporating a junction between two materials with different band gaps (i.e., a heterojunction) as the channel instead of a doped region, as is generally the case for metal oxide semiconductor field effect transistors (MOSFETs). In some embodiments, the group III-V device structure 100 is applied to a high-voltage device.

Referring to FIG. 1A, a substrate 102 is provided. The substrate 102 may be made of silicon (Si) or another semiconductor material. In some embodiments, the substrate 102 is a silicon wafer. In some embodiments, the substrate 102 is a silicon substrate having (111) lattice structure. The Si (111) substrate provides an optimal lattice mismatch with an overlying layer, such as a GaN layer. In some embodiments, the substrate 102 is made of a compound semiconductor such as silicon carbide (SiC), gallium arsenic (GaAs), indium arsenide (InAs), or indium phosphide (InP). In some embodiments, the substrate 102 is made of an alloy semiconductor such as silicon germanium, silicon germanium carbide, gallium arsenic phosphide, or gallium indium phosphide.

Afterwards, a number of group III-V" compound layers formed over the substrate 102. The term of "group III-V" compound layers denotes a semiconductor material that includes at least one element from Group IIIA (group 13 under the modern International Union of Pure and Applied Chemistry (IUPAC)) and at least one element from Group VA (group 15 under the modern International Union of Pure and Applied Chemistry (IUPAC)) of the Periodic Table of Elements. Typically, the compound semiconductors are binary, ternary or quaternary alloys including III/V elements.

Figure 1B:
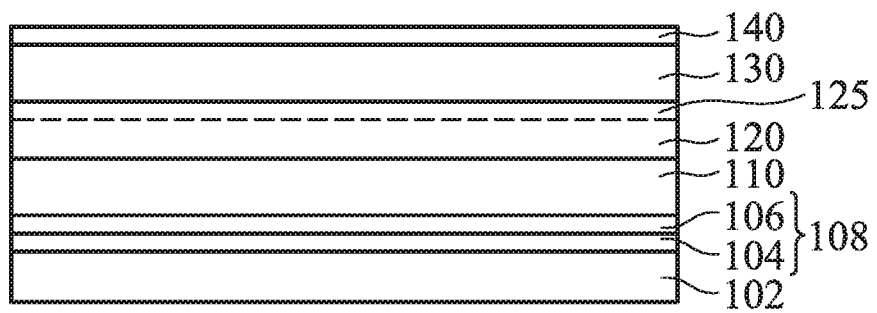

Afterwards, as shown in FIG. 1B, a transition structure 108 is formed over the substrate 102, in accordance with some embodiments of the disclosure. The transition structure 108 includes multiple layers. In some embodiments, the transition structure 108 includes a nucleation layer 104 and a transition layer 106 on the nucleation layer 104.

The nucleation layer 104 is used to compensate for a mismatch in lattice structures and/or a thermal expansion coefficient (TEC) between the substrate 102 and an overlying layer (e.g. the transition layer 106). In some embodiments, the nucleation layer 104 includes a step-wise change in lattice structure. In some embodiments, the nucleation layer 104 includes aluminum nitride (AlN). In some embodiments, the nucleation layer 104 has a thickness in a range from about 100 angstroms (Å) to 350 angstroms (Å).

The transition layer 106 is used to facilitate gradual changes of the lattice structure and thermal expansion coefficient (TEC) between the nucleation layer 104 and an overlying layer (e.g. the buffer layer 110). In some embodiments, the transition layer 106 includes a graded aluminum gallium nitride layer ($Al_xGa_{1-x}N$), wherein x is the aluminum content ratio in the aluminum gallium constituent, and 0<x<1. In some embodiments, the graded aluminum gallium nitride layer includes multiple layers each having a decreased x ratio (from a bottom layer adjoining the nucleation layer 104 to a top layer adjoining the buffer layer 110). In some embodiments, the graded aluminum gallium nitride layer has three layers having the x ratio in the range of 0.7-0.9 for the bottom layer, in the range of 0.4-0.6 for a middle layer, and in the range of 0.15-0.3 for the top layer. In some embodiments, instead of having multiple layers with different x ratios, the graded aluminum gallium nitride layer has a continuous gradient in the x ratio. In some embodiments, the transition layer 106 has a thickness that ranges from about 0.5 micrometers (μm) to 1.5 micrometers (μm).

In some embodiments, the nucleation layer 104 and the transition layer 106 are formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

A buffer layer 110 is formed over the transition structure 108. The buffer layer 110 is configured to define a high resistivity layer for increasing the breakdown voltage of the group III-V device structure 100. The buffer layer 110 has a higher resistivity than the resistivity of the channel layer 120 (shown in FIG. 1D).

In some embodiments, the buffer layer 110 includes one or more Group III-V compound layers. Examples of Group III-V compound layers include, but are not limited to, GaN, AlGaN, InGaN and InAlGaN. In some embodiments, the buffer layer 110 includes a dopant to achieve a predetermined high resistivity. In some embodiments, the dopant is a p-type dopant. In some embodiments, the buffer layer 110 includes GaN doped with the p-type dopant. Examples of the p-type dopant include, but are not limited to, carbon (C), iron (Fe), magnesium (Mg) and zinc (Zn). In some embodiments, the buffer layer 110 has a thickness in a range from about 0.5 micrometers (μm) to 2.5 micrometers (μm).

In some embodiments, the buffer layer 110 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Afterwards, the channel layer 120 is formed over the buffer layer 110. The channel layer 120 has a lower resistivity than the buffer layer 110, for improving current performance of the group III-V device structure 100.

In some embodiments, the channel layer 120 includes one or more Group III-V compound layers. Examples of Group III-V compound layers include, but are not limited to, GaN, AlGaN, InGaN and In AlGaN. One or more of the Group III-V compound layers is doped. In some embodiments, the channel layer 120 includes alternatingly arranged p-doped and n-doped Group III-V compound layers. In some embodiments, the channel layer 120 includes a p-doped GaN layer. Examples of the p-type dopant in the p-doped GaN layer include, but are not limited to, carbon (C), iron (Fe), magnesium (Mg) and zinc (Zn). In some other embodiment, the channel layer 120 includes an un-doped GaN layer. In some embodiments, the channel layer 120 has a thickness in a range from about 0.2 micrometers (μm) to 0.6 micrometers (μm).

In some embodiments, the channel layer 120 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Afterwards, an active layer 130 is formed over the channel layer 120. The active layer 130 configured to cause a two dimensional electron gas (2DEG) to be formed in the channel layer 120 along an interface 125 between the channel layer 120 and the active layer 130. A heterojunction is formed between the active layer 130 and the channel layer 120. A band gap discontinuity exists between the active layer 130 and the channel layer 120. In some embodiments, the band gap of the active layer 130 is greater than the band gap of the channel layer 120. The electrons from a piezoelectric effect in the active layer 130 drop into the channel layer 120, and thus create a thin layer 122 of highly mobile conducting electrons, i.e., the 2DEG, in the channel layer 120, adjacent the interface 125 with the active layer 130. The electrons in the 2DEG are charge carriers in the channel layer 120.

Figure 1C:
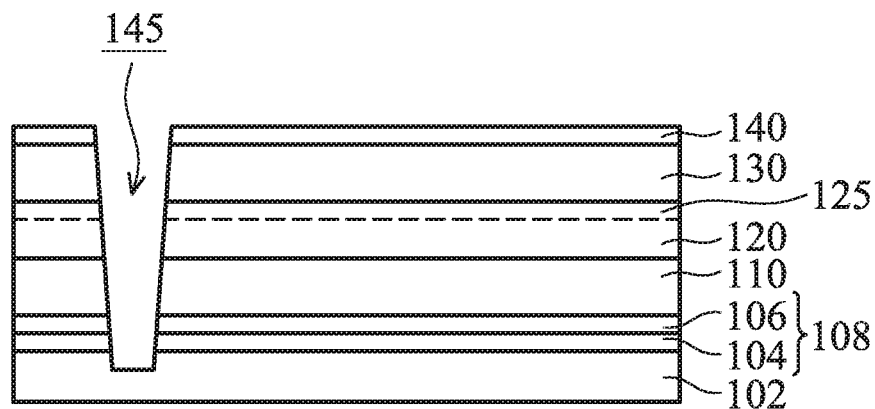
Figure 1D:
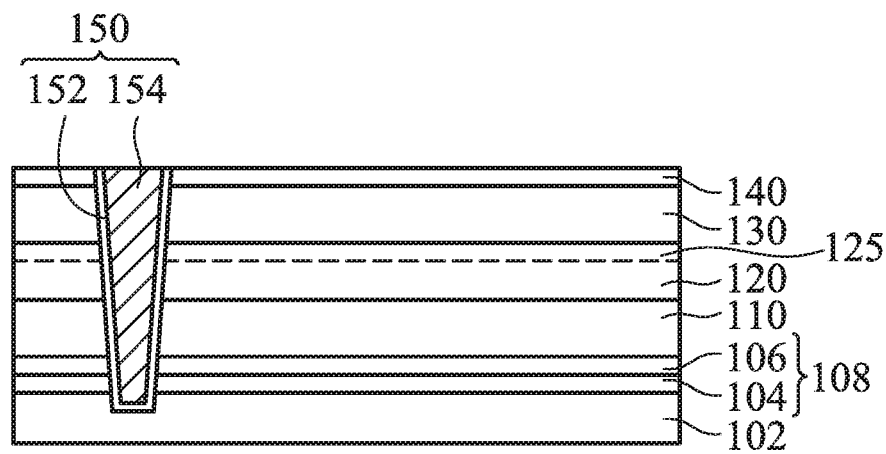
Figure 1E:
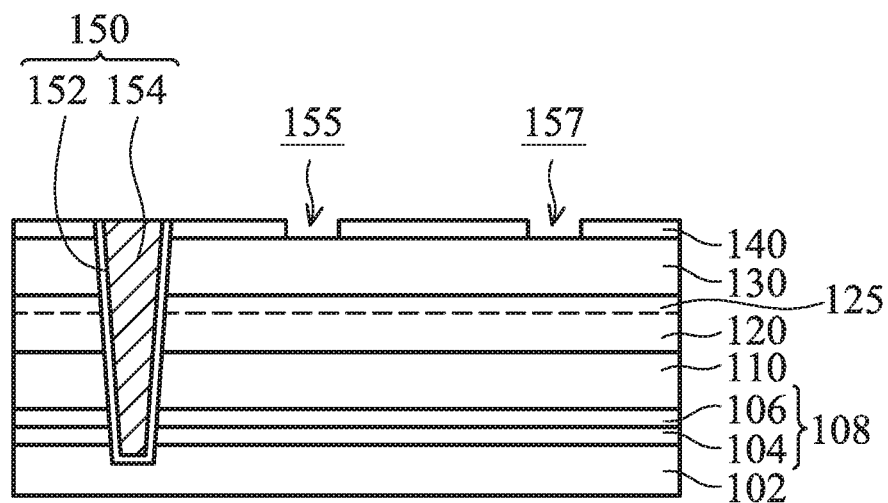
Figure 1F:
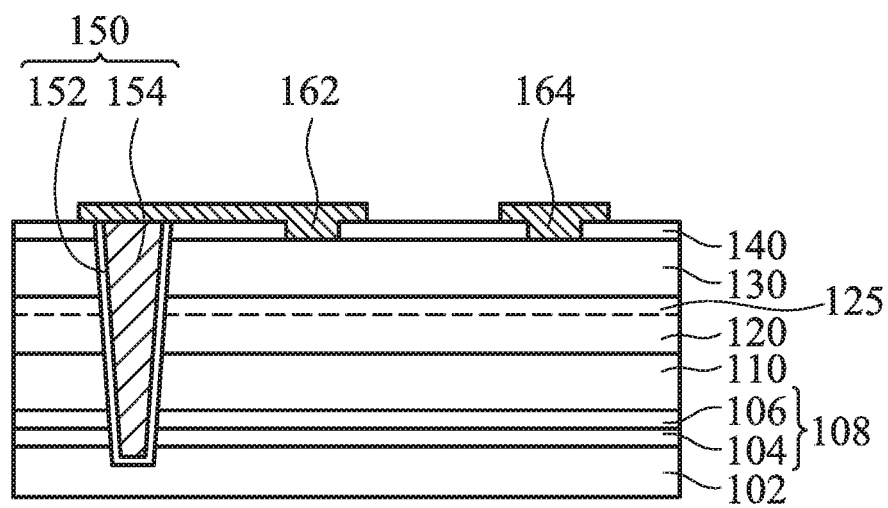
Figure 1G:
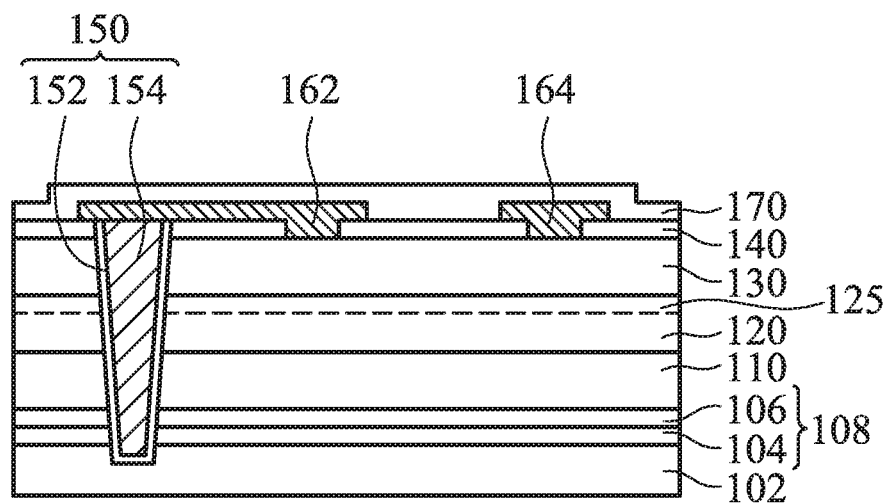
Figure 1H:
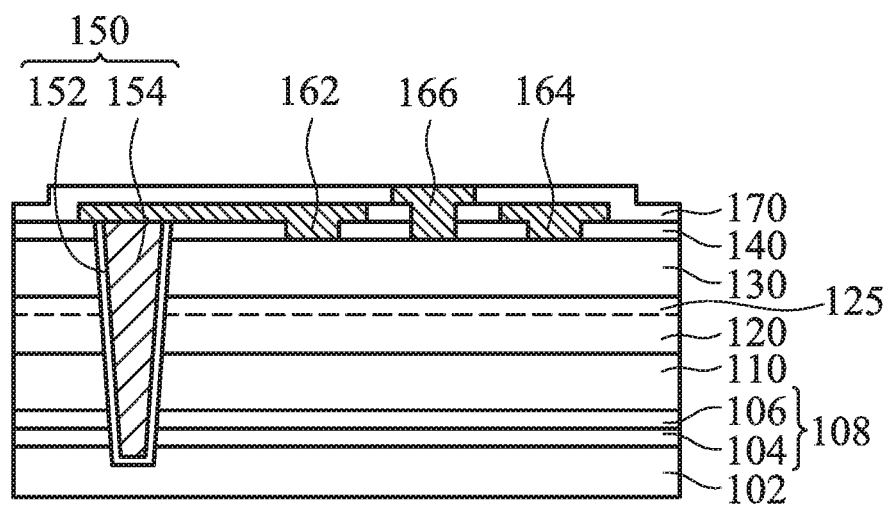

Due to the naturally occurring 2DEG and without the gate structure, the group III-V device structure 100 would be conductive without the application of a voltage to a gate electrode 166 (shown in FIG. 1H). Therefore, the group III-V device structure 100 would be a normally ON device with a negative threshold voltage. Such a normally ON state is a design concern in power applications where it is desirable to prevent, or substantially inhibit, current from flowing in or through the group III-V device structure 100.

Next, as shown in FIG. 1B, a first dielectric layer 140 is formed over the active layer 130, in accordance with some embodiments of the disclosure. The first dielectric layer 140 may be made of silicon oxide, silicon nitride, silicon oxynitride, or a combination thereof. In some embodiments, the first dielectric layer 140 is formed by a deposition process, such as chemical vapor deposition (CVD) process, atomic layer deposition (ALD) process or another application deposition process.

Afterwards, as shown in FIG. IC, a trench 145 is formed through the first dielectric layer 140, the active layer 130, the channel layer 120, the buffer layer 110, the transition structure 108 and a portion of the substrate 102, in accordance with some embodiments of the disclosure. A portion of the substrate 102 is exposed by the trench 145. In some embodiments, the bottom surface of the trench 145 is lower than a top surface of the substrate 102. In some other embodiments, the bottom surface of the trench 145 is leveled with the top surface of the substrate 102. The trench 145 has a top opening and a bottom surface, and the top opening is wider than the bottom surface.

The trench 145 is formed by a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Afterwards, as shown in FIG. 1D, a through via structure 150 is formed in the trench 145, in accordance with some embodiments of the disclosure. The through via structure 150 is formed at a front-end-of-line (FEOL). The through via structure 150 includes a diffusion barrier layer 152 and a conductive layer 154. The through via structure 150 will connect to ground to eliminate the background noise or background interference. Therefore, the substrate 102 is grounded.

The diffusion barrier layer 152 is conformally formed in the sidewalls and bottom surface of the trench 145, and then a conductive layer 154 is formed on the diffusion barrier layer 152. Next, the excess of the diffusion barrier layer 152 and the conductive layer 154 out of the trench 145 are removed by an etching back process, such as chemical mechanical polishing (CMP) process. In some embodiments, the diffusion barrier layer 152 is made of Ta, TaN, Ti, TiN, or CoW. In some embodiments, the diffusion barrier layer 152 is formed by a physical vapor deposition (PVD) process. In some embodiments, the conductive layer 154 is made of tungsten (W), tungsten alloy, copper (Cu), copper alloy, aluminum (Al), aluminum alloys, or a combination thereof. Alternatively, other applicable materials may be used. In some embodiments, the conductive layer 154 is formed by an electroplating process. In some embodiments, the conductive layer 154 is made of tungsten (W). The advantage of tungsten (W) is that tungsten (W) has a better trench filling ability, and thus tungsten (W) is easily filled into the trench 145 without the formation of voids. In some embodiments, the through via structure 150 has an aspect ratio in a range from about 1.5 to about 3.5. In some embodiments, the depth of the through via structure 150 is in a range from about 3 μm to about 6 μm. If the aspect ratio is too large, the depth of the trench 145 is too large and the filling of the conductive layer 154 may become difficult. If the aspect ratio is too small, the width of the trench 145 is too large, and it is hard to control the topography of the through via structure to have an even surface.

Afterwards, as shown in FIG. 1E, a first opening 155 and a second opening 157 are formed in the first dielectric layer 140, in accordance with some embodiments of the disclosure. As a result, a portion of a top surface of the active layer 130 is exposed by the first opening 155 and the second opening 157. The first opening 155 and the second opening 157 are formed by a photolithography process and an etching process.

Afterwards, as shown in FIG. 1F, a source electrode 162 is formed in the first opening 155 and on the first dielectric layer 140 to connect to the through via structure 150, in accordance with some embodiments of the disclosure.

The source electrode 162 is electrically connected to the through via structure 150. In addition, the drain electrode 164 is formed in the second opening 157 and on a portion of the first dielectric layer 140. In some embodiments, the source electrode 162 is made of Ti/Al/Ti/TaN. In some embodiments, the drain electrode 164 is made of Ti/Al/Ti/TaN.

Next, as shown in FIG. 1G, a second dielectric layer 170 is formed on the source electrode 162, the drain electrode 164 and the first dielectric layer 140, in accordance with some embodiments of the disclosure.

The second dielectric layer 170 may be made of silicon oxide, silicon nitride, silicon oxynitride, or a combination thereof. In some embodiments, the second dielectric layer 170 is formed by a deposition process, such as chemical vapor deposition (CVD) process, atomic layer deposition (ALD) process or another application deposition process.

Afterwards, as shown in FIG. 1H, a gate electrode 166 is formed in the second dielectric layer 170 and the first dielectric layer 140, in accordance with some embodiments of the disclosure. The top surface of the gate electrode 166 is higher than the top surface of the source electrode 162 or the top surface of the drain electrode 164.

In some embodiments, to convert a normally ON group III-V device structure 100 to a normally OFF group III-V device structure 100a, the gate electrode 166 over the active layer 130 is configured to deplete the 2DEG under the gate electrode 166.

The gate electrode 166 may be made of conductive materials, such as metal or alloy. In some embodiments, the gate electrode 166 is made of TiN/Ti/AlCu/TiN.

Figure 1I:
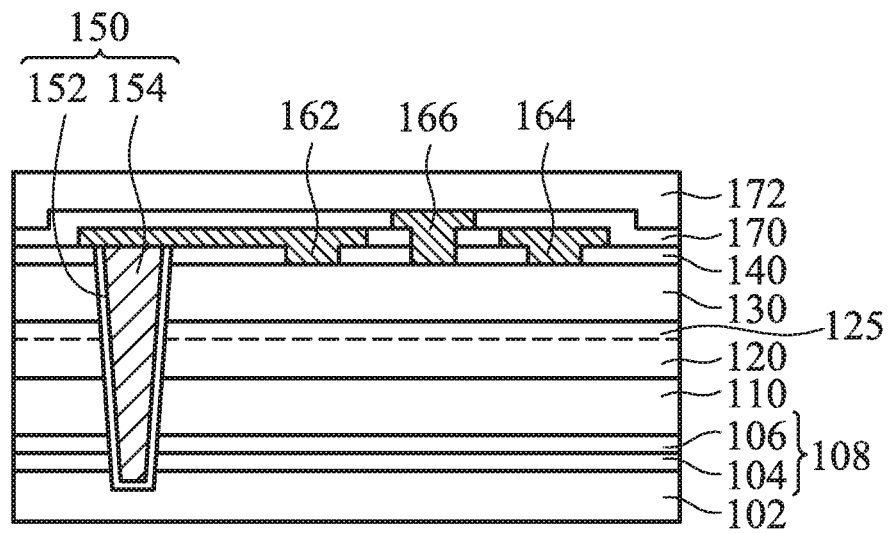

Next, as shown in FIG. 1I, a third dielectric layer 172 is formed over the second dielectric layer 170, in accordance with some embodiments of the disclosure. The third dielectric layer 172 and the second dielectric layer 170 may be made of the same material.

Figure 1J:
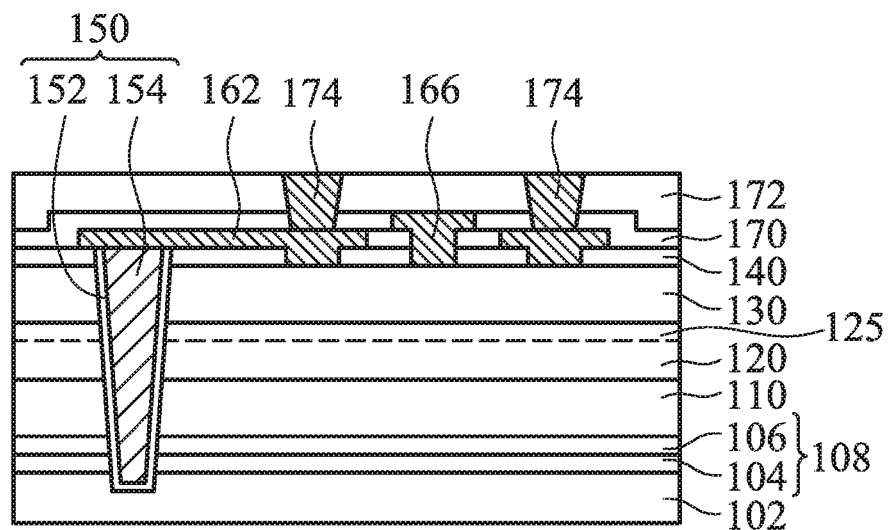

Afterwards, as shown in FIG. 1J, a contact structure 174 is formed through the third dielectric layer 172 and the second dielectric layer 170 to make contact with the source electrode 162 and the drain electrode 164, in accordance with some embodiments of the disclosure. More specifically, the contact structure 174 is electrically connected to the source electrode 162, and the contact structure 174 is electrically connected to the drain electrode 614.

Figure 1K:
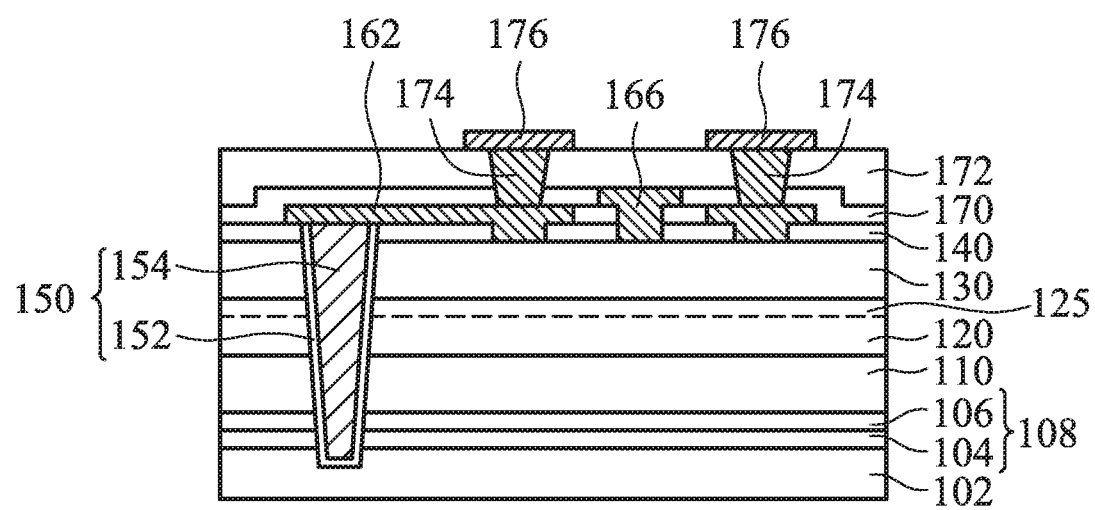

Afterwards, as shown in FIG. 1K, a first metal layer 176 is formed over the contact structure 174, in accordance with some embodiments of the disclosure. In some embodiments, the first metal layer 176 is made of copper (Cu), copper alloy, aluminum (Al), aluminum alloys, or a combination thereof.

Figure 1L:
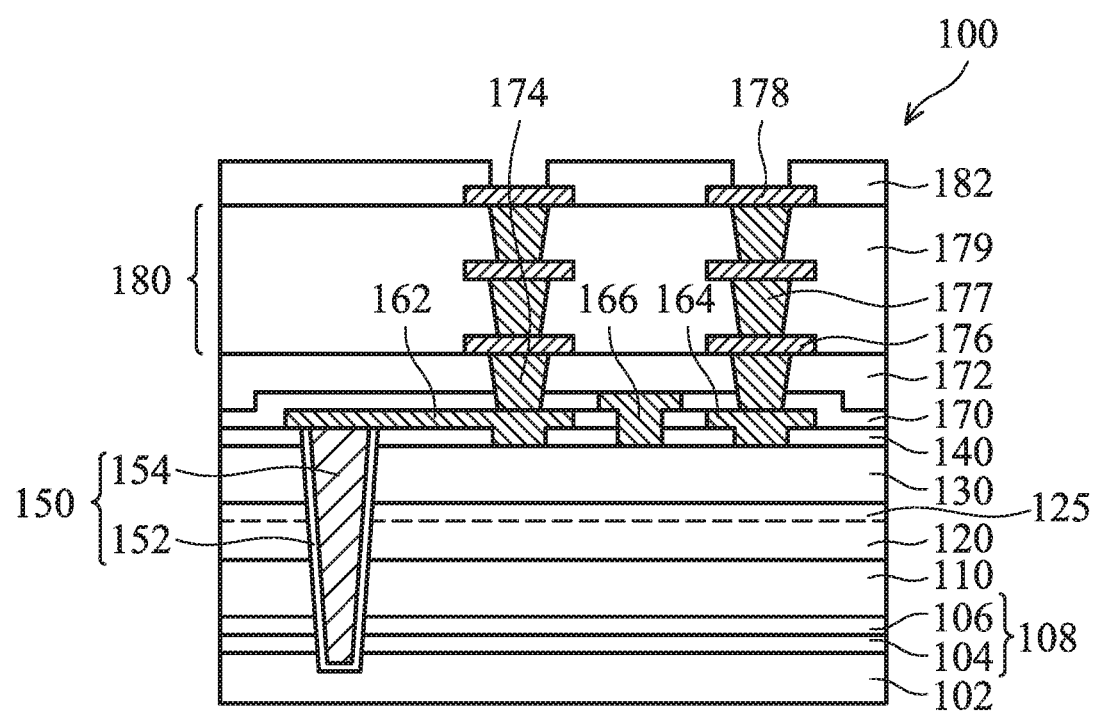

Afterwards, as shown in FIG. 1L, a first via 177 is formed over the first metal layer 176, in accordance with some embodiments of the disclosure. A number of the metal layers and a number of the vias are alternatively stacked or formed in a fourth dielectric layer 179 to form an interconnect structure 180. A top metal layer 178 is formed over the fourth dielectric layer 179, and a passivation layer 182 is formed over the interconnect structure 180. Then, a portion of the passivation layer 182 is removed to expose the top metal layer 178. Afterwards, a wire (not shown) is connected to the exposed top metal layer 178 to electrically connect the source electrode 162, and the wire is electrically connected to ground. Therefore, the source electrode 162 and the through via structure 150 are grounded to reduce the background noise.

In this embodiment, the through via structure 150 is formed before the interconnect structure 180 is formed, and therefore the through via structure 150 is formed in a front-end-of-line (FEOL). If the through via structure is formed in a back-end-of-line (BEOL), a deep trench will be formed by through the fourth dielectric layer 179, the third dielectric layer 172, and the second dielectric layer 170. The filling material (e.g. the conductive layer and the diffusion barrier layer) is difficult to fill into a deep trench, and some unwanted voids or cracks may be formed between the conductive layer and the diffusion barrier layer due to the stress. By forming the through via structure 150 in the FEOL, the problem of having unwanted voids or cracks may be prevented. In addition, the through via structure 150 is formed at a front-end-of-line (FEOL), rather than at the back-end-of-line (BEOL), and the smaller area in the group III-V compound layers (such as layers 108, 110, 120 and 130) is used to form the through via structure 150 and does not occupy too large area.

Figure 2A:
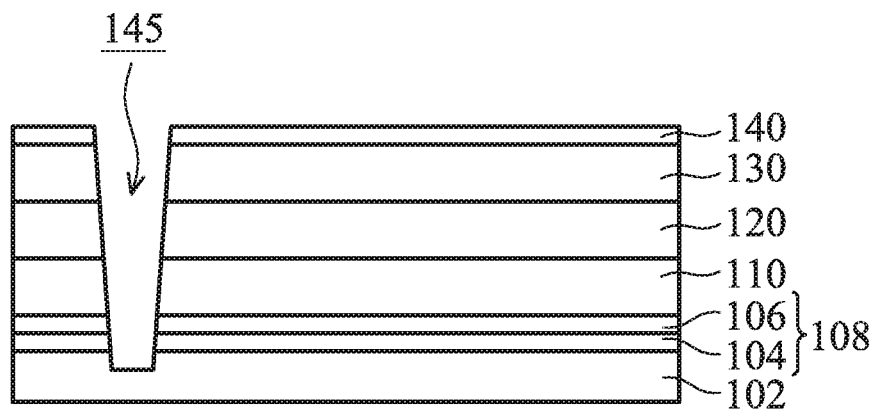
FIGS. 2A-2C show cross-sectional representations of various stages of forming a group III-V device structure, in accordance with some embodiments of the disclosure.
Figure 2B:
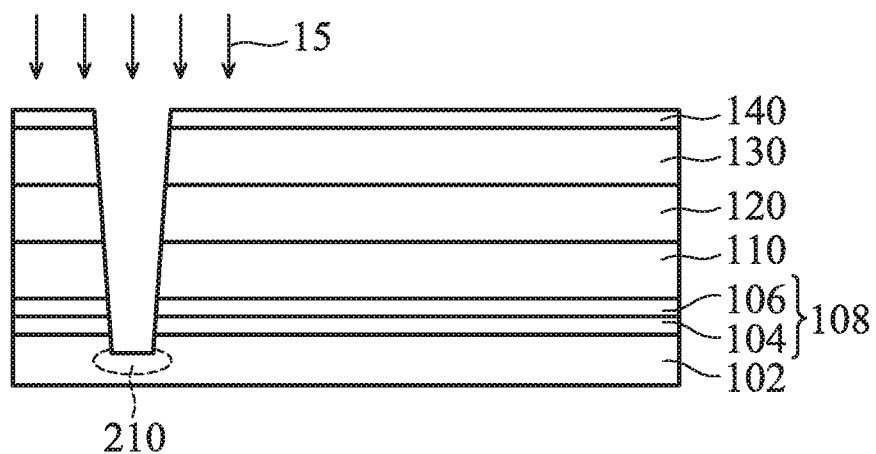
Figure 2C:
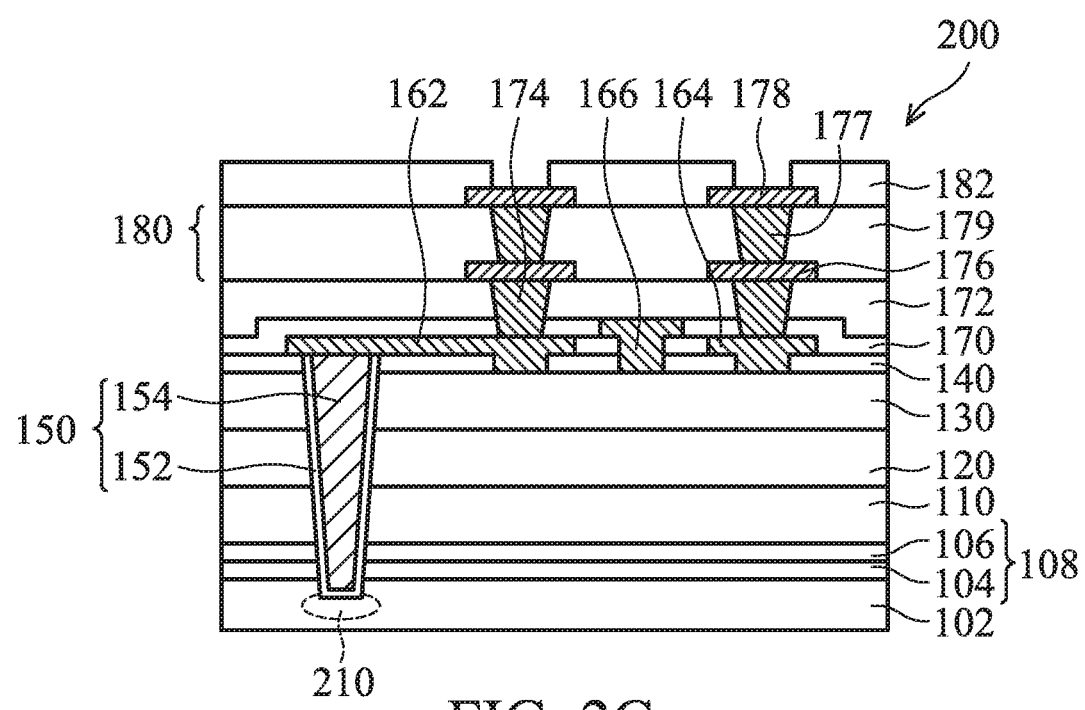

FIGS. 2A-2C show cross-sectional representations of various stages of forming a group III-V device structure 200, in accordance with some embodiments of the disclosure. Processes and materials used to form the group III-V device structure 200 may be similar to, or the same as, those used to form the group III-V device structure 100 and are not repeated herein.

The structure shown in FIG. 2A is similar to that in FIG. 1C. The trench 45 is formed through multiple layers including the first dielectric layer 140, the active layer 130, the channel layer 120, the buffer layer 110, the transition structure 108 and a portion of the substrate 102.

Afterwards, as shown in FIG. 2B, an implant process 15 is performed on the trench 145 to form a doped well region 210 under the trench 145, in accordance with some embodiments of the disclosure. The doped well legion 210 surrounds the trench 145. In some embodiments, the implant process 15 is an ion implant process. After the implant process 15, an annealing process may be performed to activate the dopants in the doped well region 210.

In some embodiments, the doped well region 210 is doped with a first conductivity type, and the substrate 102 is doped with a second conductivity type that is different from the first conductivity type. In some embodiments, the substrate 102 is p-type, and the doped well region 210 is n-type, and therefore an n-p junction is formed between the substrate 102 and the doped well region 210. Therefore, a diode structure is constructed by the substrate 102 and the doped well region 210. The diode structure may be used as an open switch.

Next, as shown in FIG. 2C, the through via structure 150 is formed in the trench 145. The following process is similar to the process described in FIGS. 1D-1L. The source electrode 162 is electrically connected to the through via structure 150, and the contact structure 174 is electrically connected to the source electrode 162. The interconnect structure 180 is formed over the third dielectric layer 172. In this embodiment, the function of the through via structure 150 is changed and it is not configured to connect with the ground.

FIGS. 3A-3K show cross-sectional representations of various stages of forming a group III-V device structure 300, in accordance with some embodiments of the disclosure.

Figure 3A:
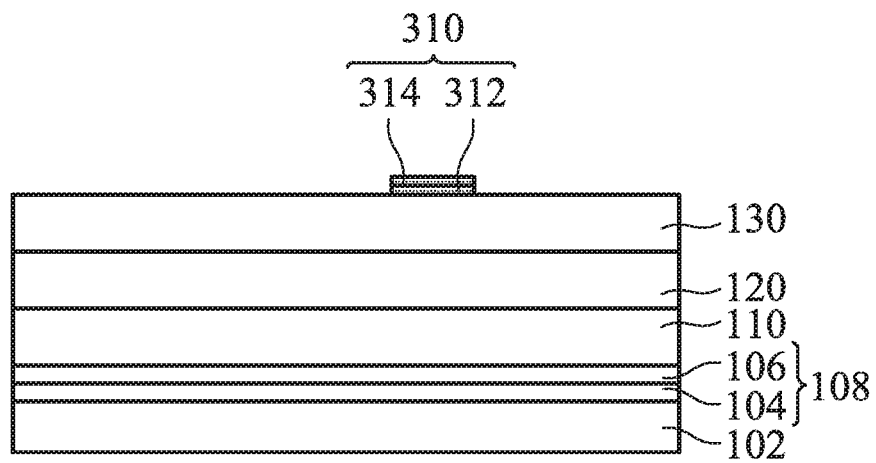
FIGS. 3A-3K show cross-sectional representations of various stages of forming a group III-V device structure, in accordance with some embodiments of the disclosure.

As shown in FIG. 3A, a NP structure 310 is formed over the active layer 130, in accordance with some embodiments of the disclosure. The NP structure 310 and a gate electrode 166 (shown in FIG. 3D) formed later construct a gate structure, and the NP structure 310 is configured to enhance the function of the gate structure for depletion of the underlying 2DEG.

The NP structure 310 includes an n-doped layer 314 and a p-doped layer 312 below the n-doped layer 314. In some embodiments, the n-doped layer 314 is made of n-doped gallium nitride (n-GaN), and the p-doped layer 312 is made of p-doped gallium nitride (p-GaN). In some other embodiments, the n-doped layer 314 is made of n-doped aluminum gallium nitride (n-AlGaN), and the p-doped layer 312 is made of p-doped aluminum gallium nitride (n-AlGaN).

Figure 3B:
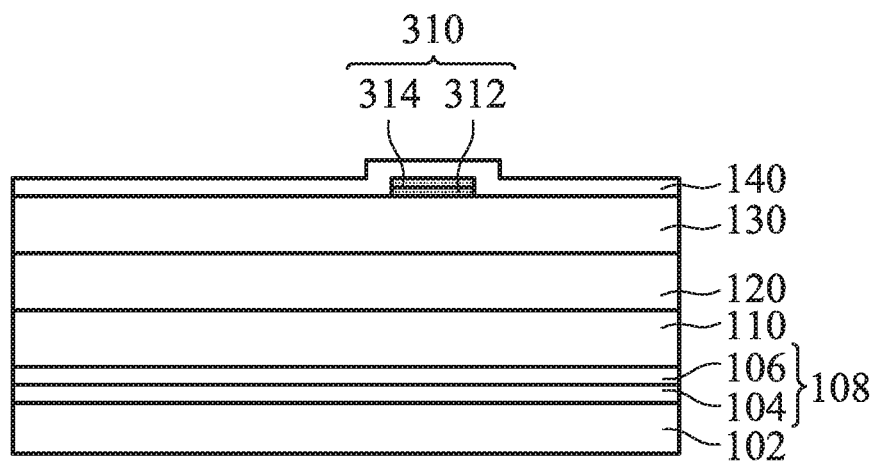

As shown in FIG. 3B, the first dielectric layer 140 is formed over the NP structure 310, in accordance with some embodiments of the disclosure. Since the NP structure 310 is higher than the top surface of the active layer 130, a portion of the first dielectric layer 140 directly above the NP structure 310 is higher than the other portion of the first dielectric layer 140 when the first dielectric layer 140 is conformally formed over the NP structure 310 and the active layer 130.

Figure 3C:
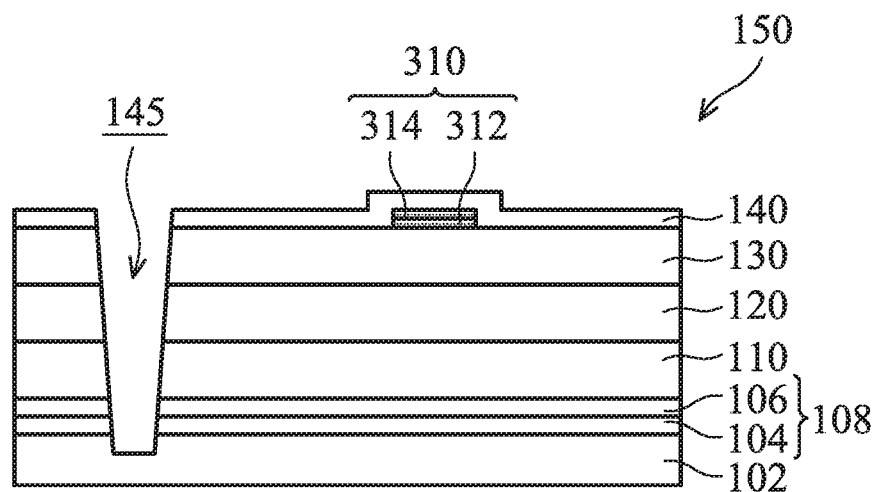

Next, as shown in FIG. 3C, the trench 145 is formed by removing a portion of the first dielectric layer 140, the active layer 130, the channel layer 120, the buffer layer 110, and the transition structure 108, in accordance with some embodiments of the disclosure. In some embodiments, a portion of the substrate 102 is removed. In some other embodiments, the substrate 102 is not removed but the top surface of the substrate 102 is exposed by the trench 145.

Figure 3D:
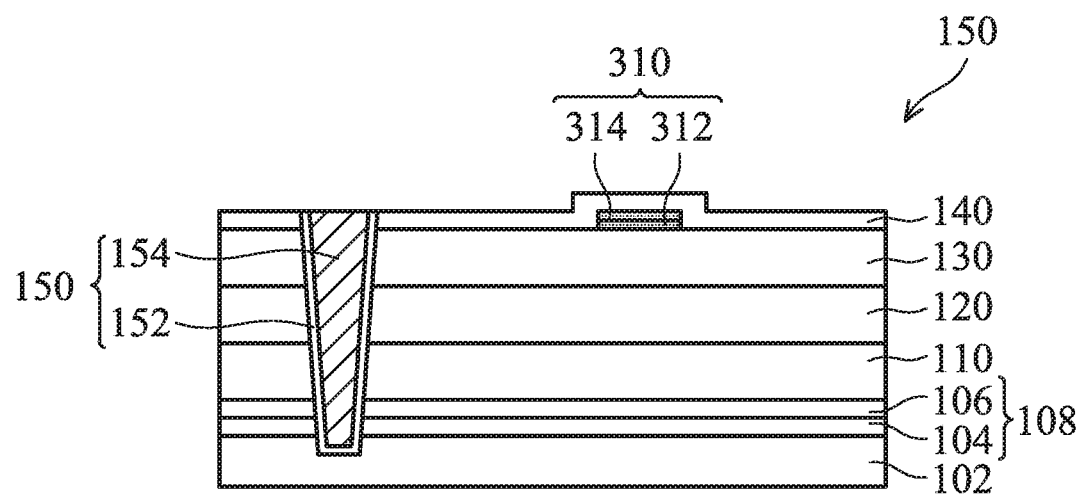

Afterwards, as shown in FIG. 3D, the through via structure 150 is formed in the trench 145, in accordance with some embodiments of the disclosure. The through via structure 150 includes the diffusion barrier layer 152 and the conductive layer 154 over the diffusion barrier layer 152.

Figure 3E:
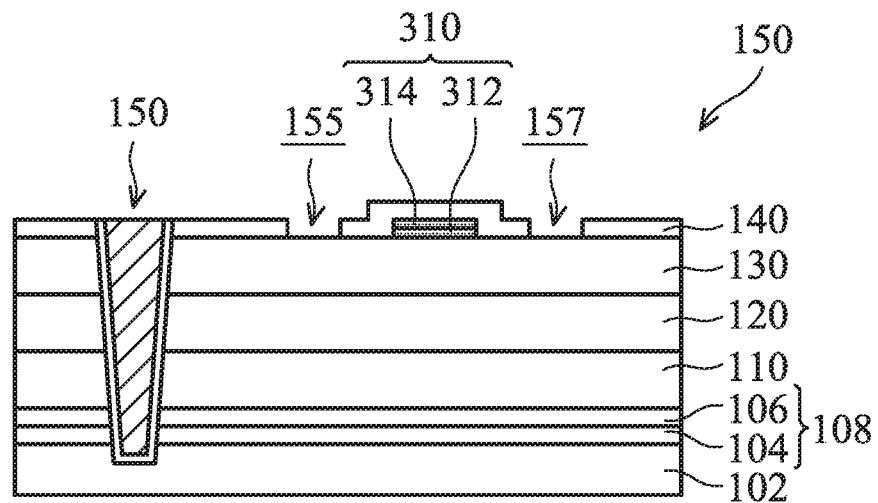

Next, as shown in FIG. 3E, the first opening 155 and the second opening 157 are formed in the first dielectric layer 140 and on the first dielectric layer 140, in accordance with some embodiments of the disclosure.

Figure 3F:
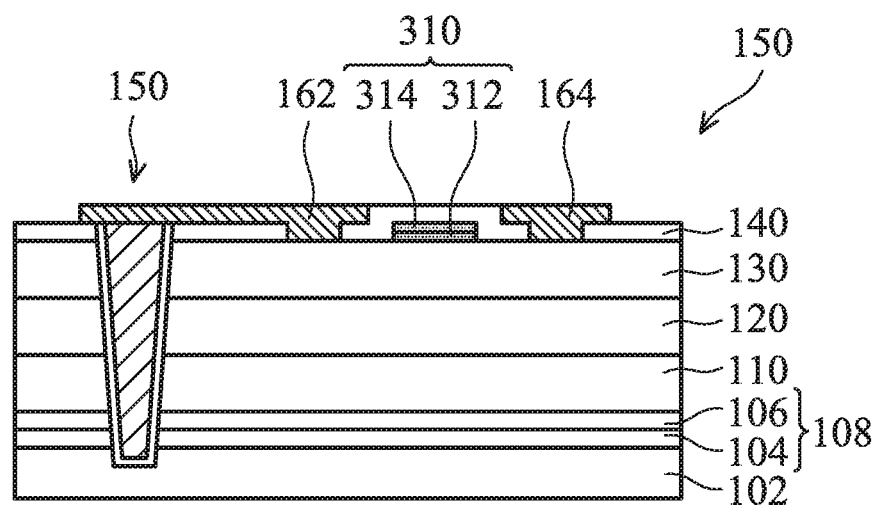

Afterwards, as shown in FIG. 3F, the source electrode 162 is formed in the first opening 155 and on the first dielectric layer 140, and the drain electrode 164 is formed in the second opening 157, in accordance with some embodiments of the disclosure. The source electrode 162 extends from a first region which is in the first opening 155 to a second region which is directly above the through via structure 150. The source electrode 162 is in direct contact with the top surface of the through via structure 150 and is electrically connected to the through via structure 150. In some embodiments, the source electrode 162 and the through via structure 150 both are grounded to eliminate the floating of the substrate 102.

Figure 3G:
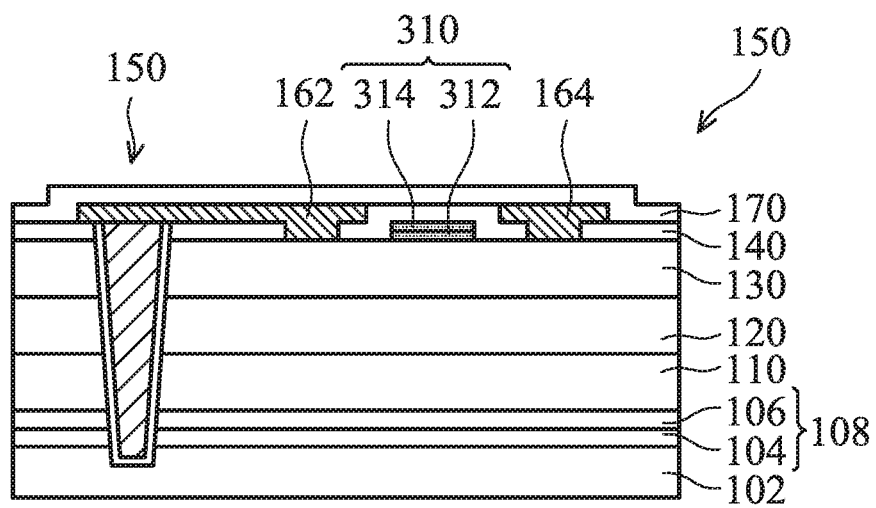

Next, as shown in FIG. 3G, the second dielectric layer 170 is formed on the source electrode 162, the drain electrode 164 and the first dielectric layer 140, in accordance with some embodiments of the disclosure.

Figure 3H:
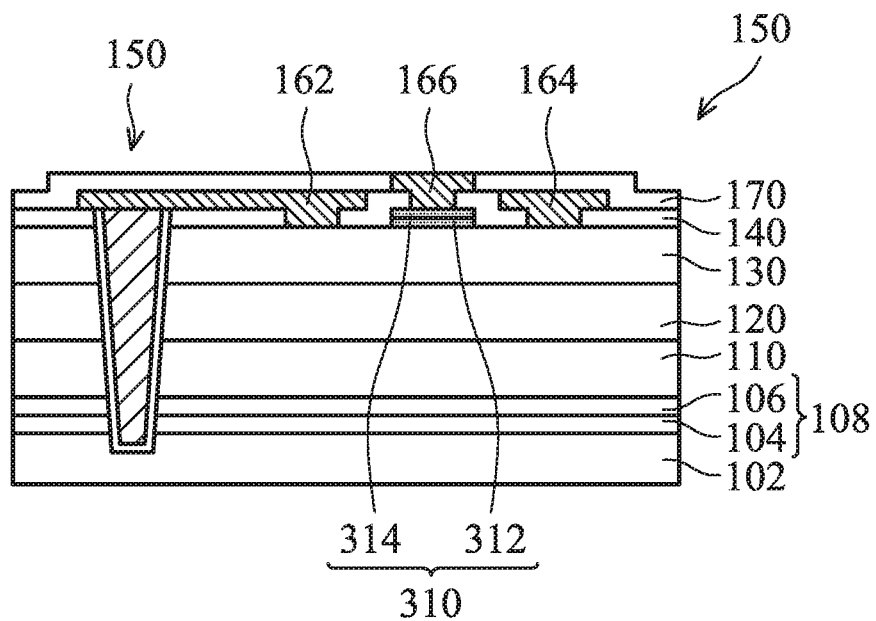

Afterwards, as shown in FIG. 3H, the gate electrode 166 is formed in the second dielectric layer 170 and the first dielectric layer 140, in accordance with some embodiments of the disclosure. A recess (not shown is firstly formed in the second dielectric layer 170 and the first dielectric layer 140, and then a gate electrode material is formed in the recess to form the gate electrode 166. The gate electrode 166 is formed on the NP structure 310 and is in direct contact with the NP structure 310. A gate structure is constructed by the NP structure 310 and the gate electrode 166. The gate structure including the NP structure 310 and the gate electrode 166 is configured to enhance the depletion of the 2DEG under the gate structure.

Figure 3I:
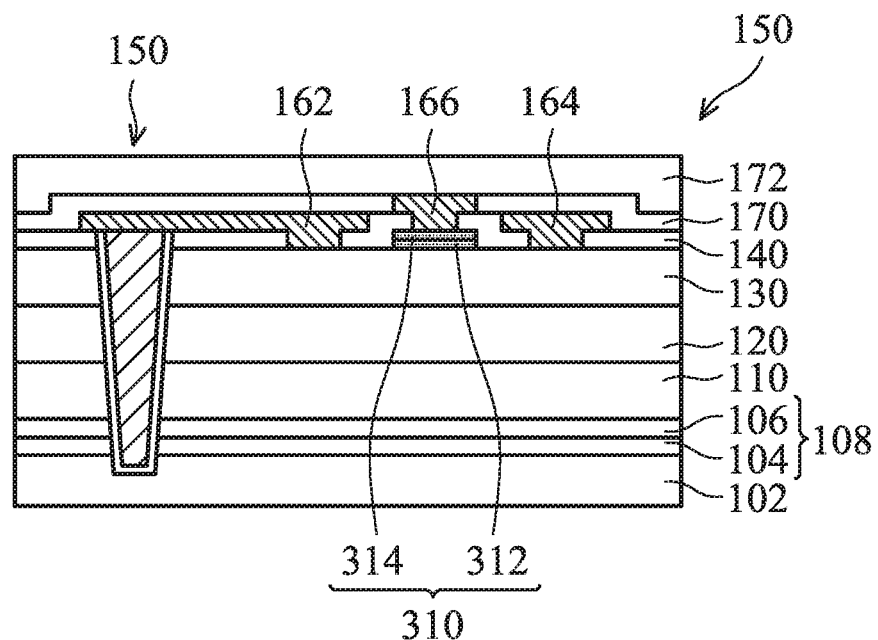

Next, as shown in FIG. 3I, the third dielectric layer 172 is formed over the second dielectric layer 170, in accordance with some embodiments of the disclosure.

Figure 3J:
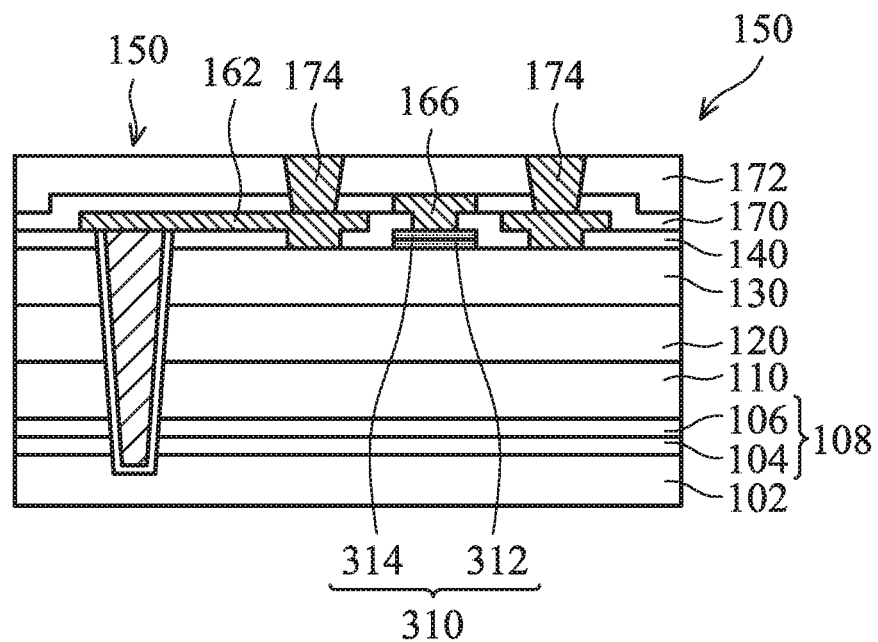

As shown in FIG. 3J, the contact structure 174 is formed through the third dielectric layer 172 and the second dielectric layer 170 to make contact with the source electrode 162 and the drain electrode 164, in accordance with some embodiments of the disclosure. More specifically, the contact structure 174 is electrically connected to the source electrode 162, and the contact structure 174 is electrically connected to the drain electrode 614.

Figure 3K:
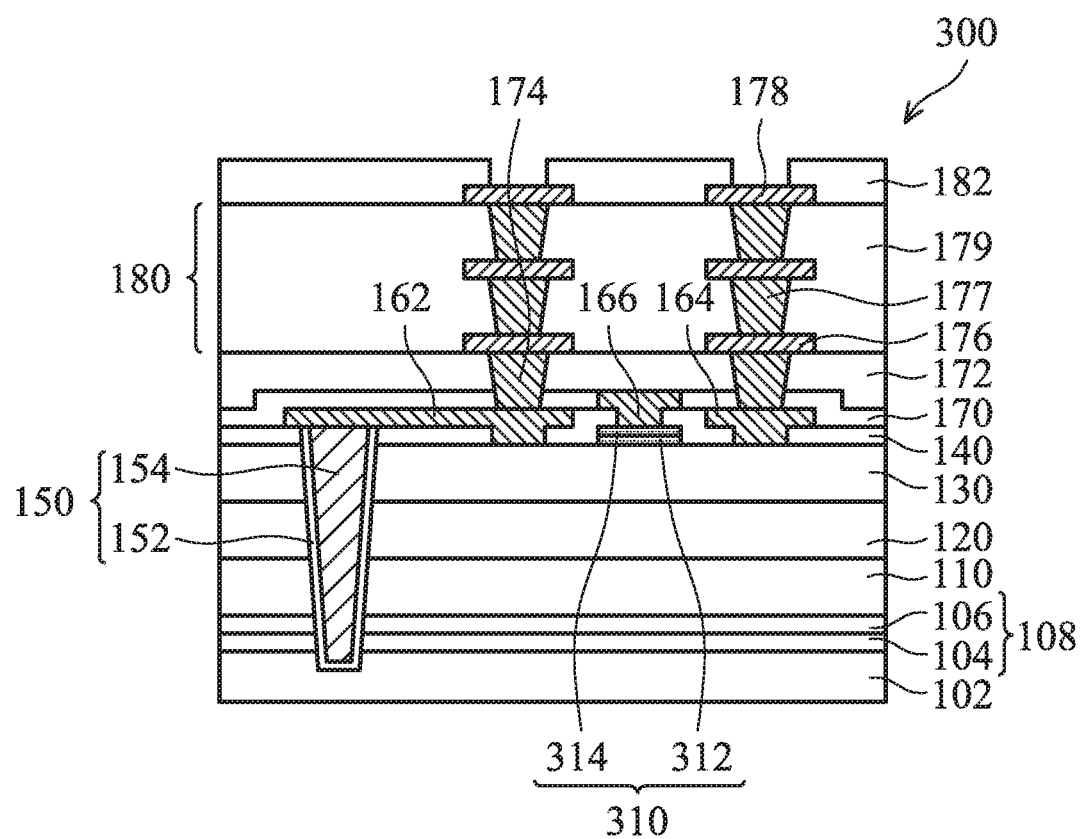
Figure 3K:
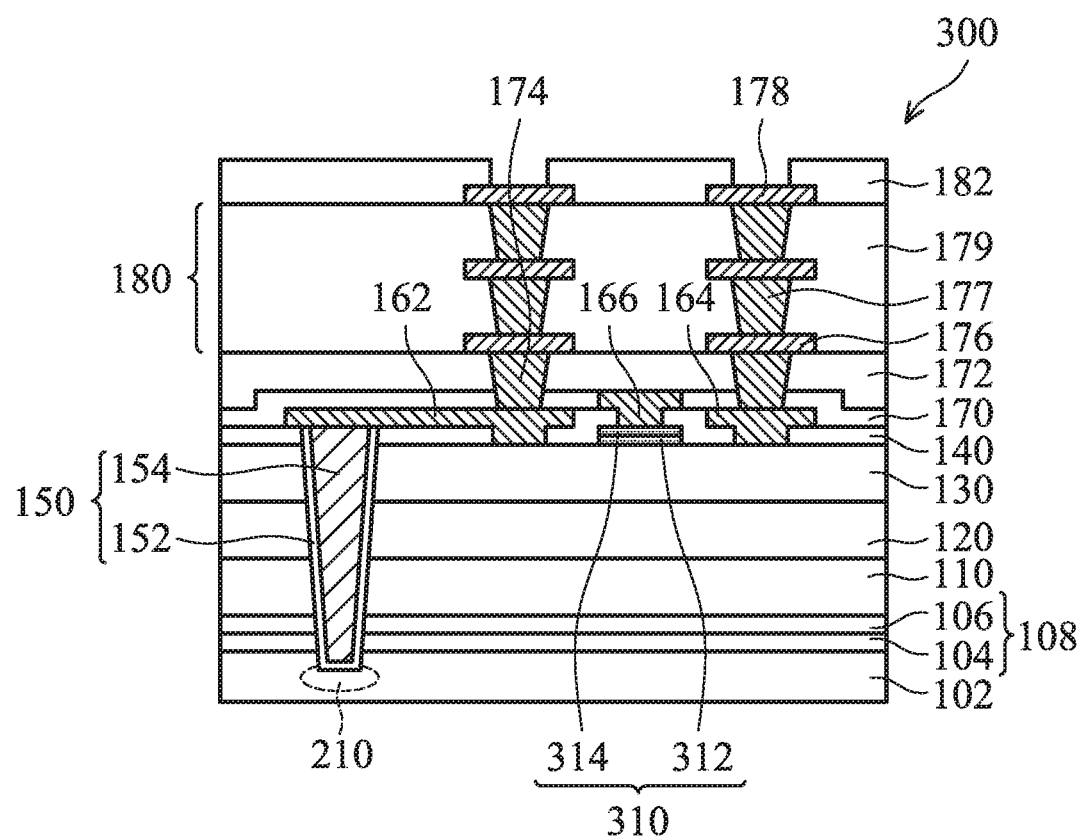

As shown in FIG. 3K, the interconnect structure 180 is formed over the third dielectric layer 172, in accordance with some embodiments of the disclosure. The interconnect structure 180 includes a number of vias (the first via 177) and a number of metal layers (such as the first metal layer 176, or the top metal layer 178) formed in the fourth dielectric layer 179.

FIG. 3K' shows a cross-sectional representation of a modified embodiment of the group III-V device structure 300. As shown in FIG. 3K', the doped well region 210 is formed under the trench 145 by the implantation process. The doped well region 210 surrounds the through via structure 150. The doped well region 210 and the substrate 102 form a p-n junction to use as a switch.

Figure 4A:
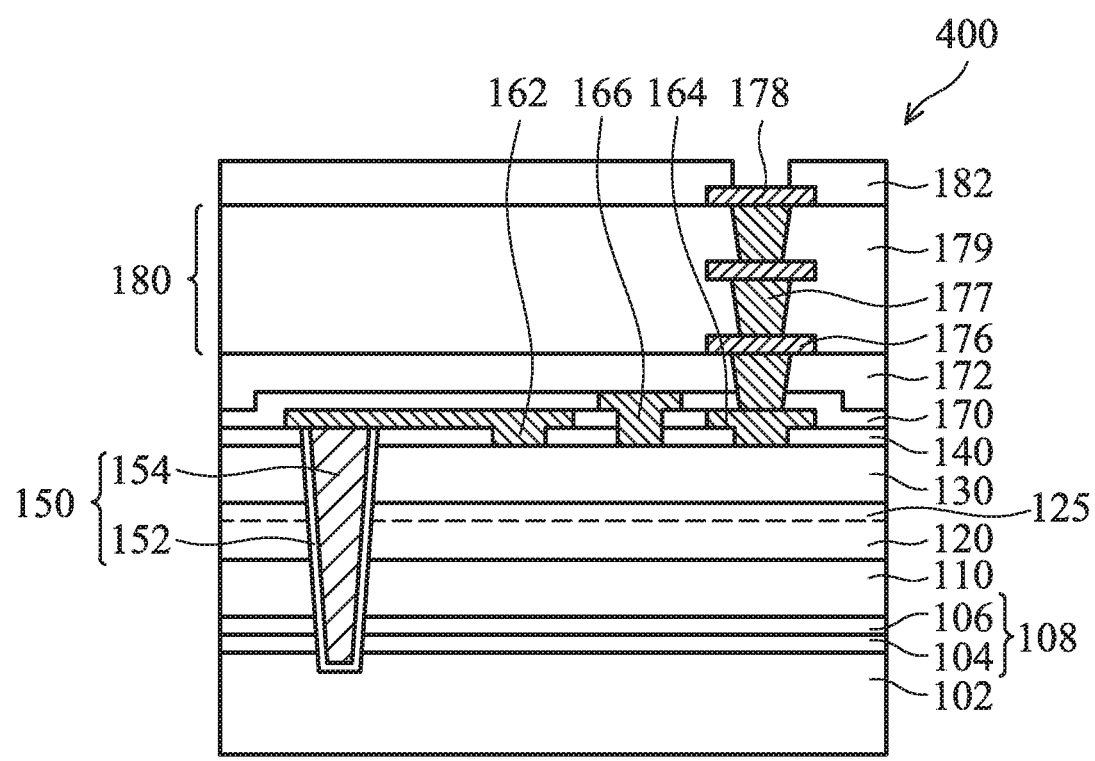
FIGS. 4A-4B show cross-sectional representations of various stages of forming a group III-V device structure, in accordance with some embodiments of the disclosure.
Figure 4B:
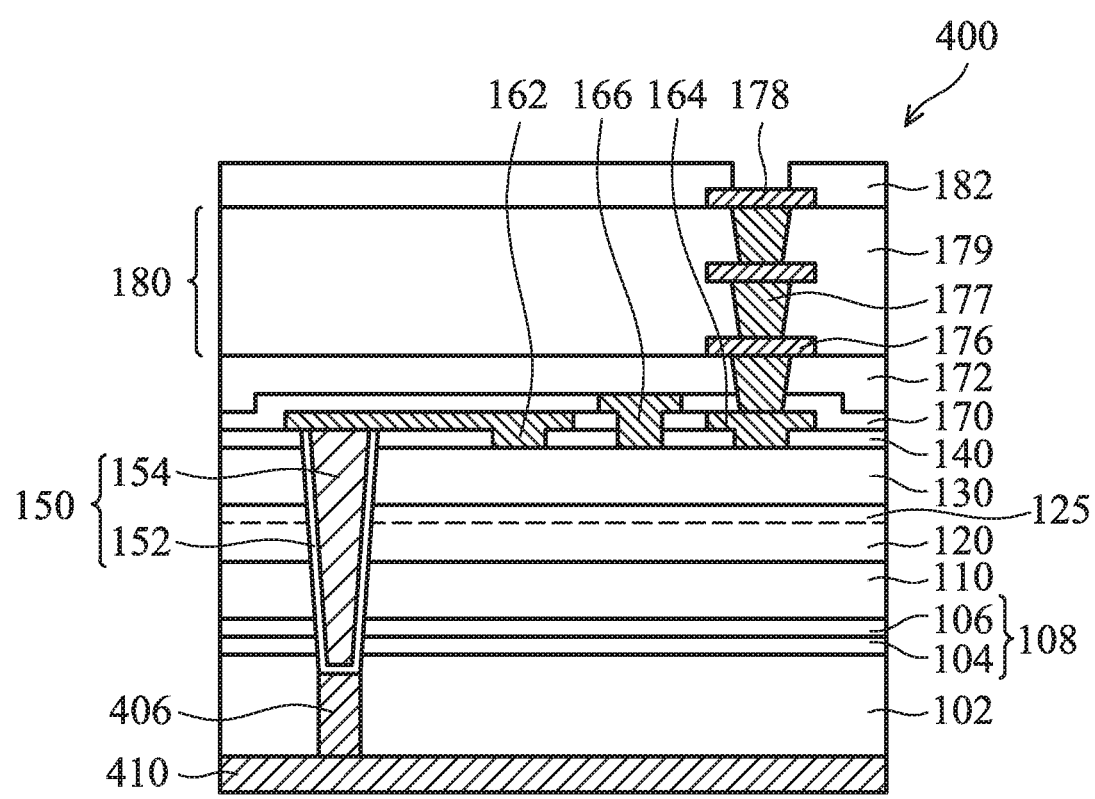

FIGS. 4A-4B show cross-sectional representations of various stages of firming a group III-V device structure 400, in accordance with some embodiments of the disclosure. In some embodiments, the group III-V device structure 400 is applied to an RF (radio frequency) device.

As shown in FIG. 4A, the through via structure 150 is electrically connected to the source electrode 162. The interconnect structure 180 is formed over the third dielectric layer 172.

As shown in FIG. 49, a through hole (not shown) is formed in the substrate 102 to expose a bottom surface of the conductive layer 154, in accordance with some embodiments of the disclosure. Afterwards, a conductive material is filled into the through hole to form a TSV (through silicon via) structure 406. Next, the bottom metal layer 410 is formed over the bottom surface of the substrate 102, and the bottom metal layer 410 is electrically connected to the TSV structure 406. The through via structure 150 is electrically connected to the bottom metal layer 410 by the TSV structure 406.

FIGS. 5A-5F show cross-sectional representations of various stages of forming a group III-V device structure 500, in accordance with some embodiments of the disclosure.

Figure 5A:
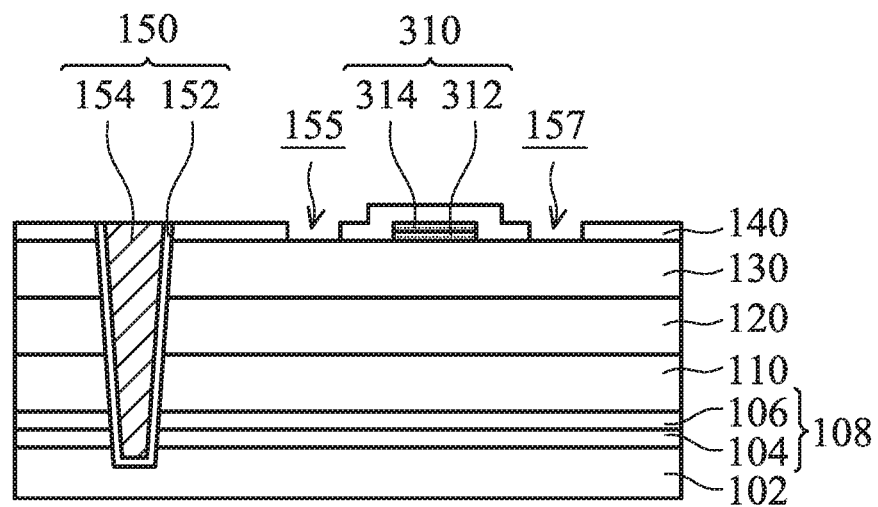
FIGS. 5A-5F show cross-sectional representations of various stages of forming a group III-V device structure, in accordance with some embodiments of the disclosure.

The structure shown in FIG. 5A is similar to the structure shown in FIG. 3E. The NP structure 310 is formed over the active layer 130, and the first dielectric layer 140 is formed over the active layer 130 and the NP structure 310. The first opening 155 and the second opening 157 are formed in the first dielectric layer 140.

Figure 5B:
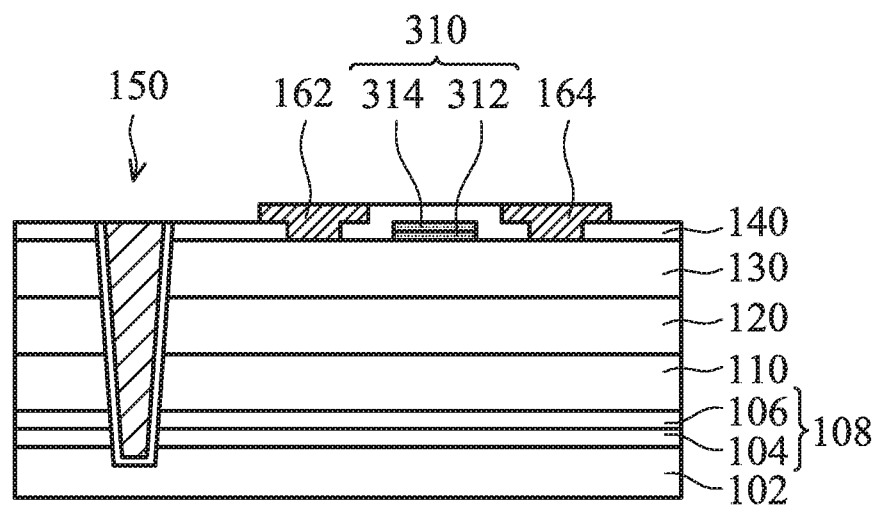

Next, as shown in FIG. 5B, the source electrode 162 is formed in the first opening 155, and the drain electrode 164 is formed in the second opening 157, in accordance with some embodiments of the disclosure.

Figure 5C:
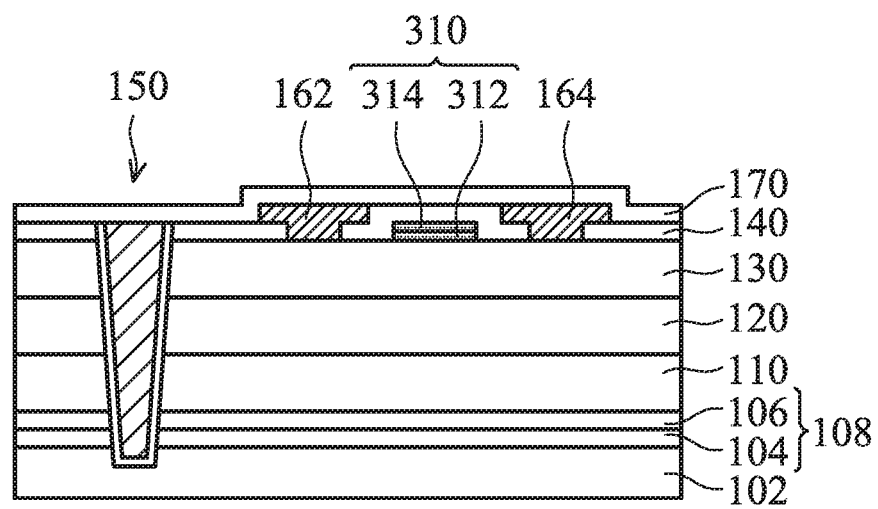

Afterwards, as shown in FIG. 5C, the second dielectric layer 170 is formed on the source electrode 162, the drain electrode 164 and the first dielectric layer 140, in accordance with some embodiments of the disclosure.

Figure 5D:
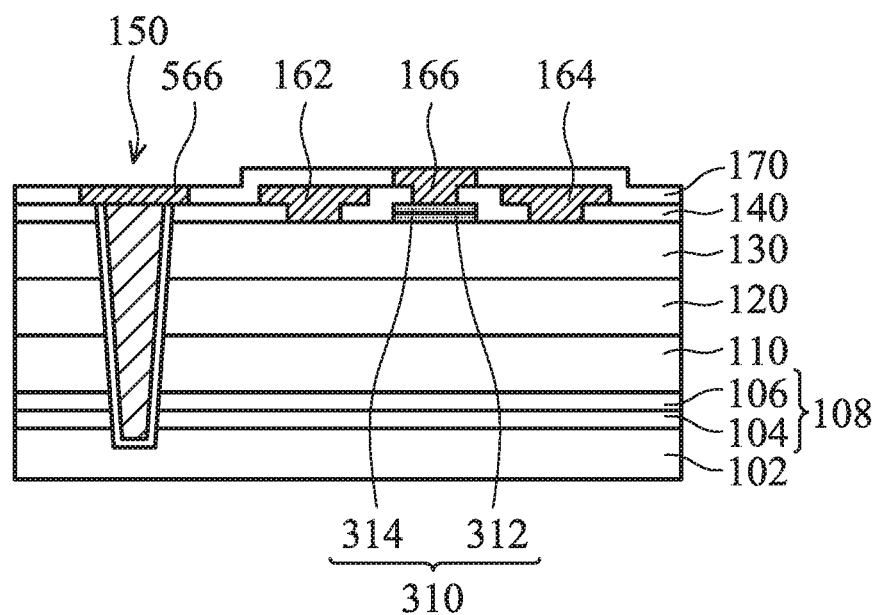

Afterwards, as shown in FIG. 5D, the gate electrode 166 is formed in the second dielectric layer 170 and the first dielectric layer 140, in accordance with some embodiments of the disclosure. In addition, a conductive layer 566 is formed on and in direct contact with the through via structure 150. The conductive layer 566 is electrically connected to the through via structure 150.

Figure 5E:
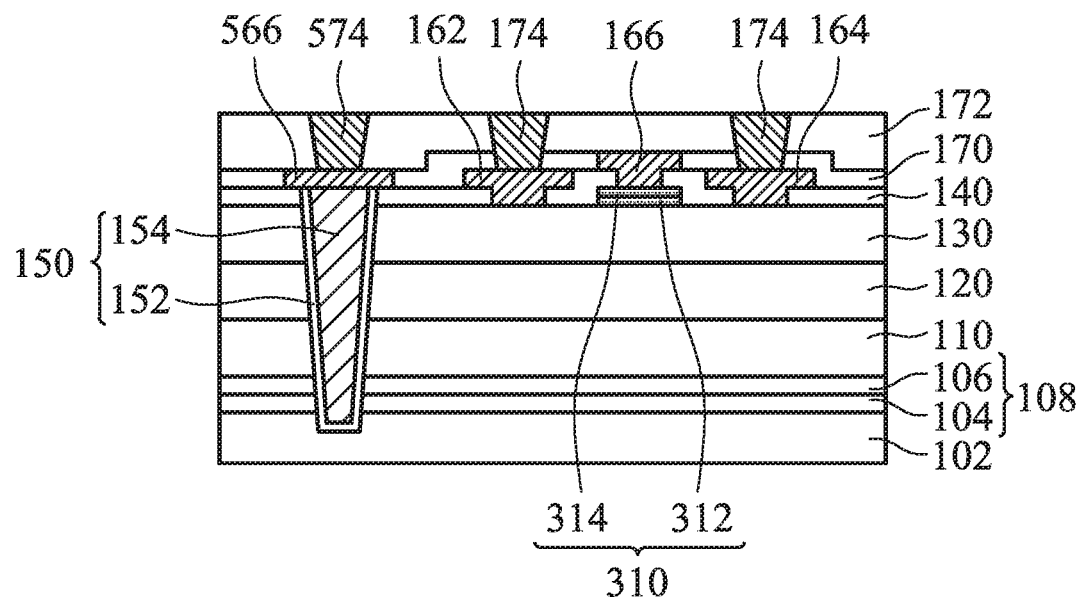

Next, as shown in FIG. 5E, the contact structure 174 is formed through the third dielectric layer 172 and the second dielectric layer 170 to make contact with the source electrode 162 and the drain electrode 164, in accordance with some embodiments of the disclosure. In addition, the second contact structure 574 is formed through the third dielectric layer 172 and in direct contact with the conductive layer 566.

Figure 5F:
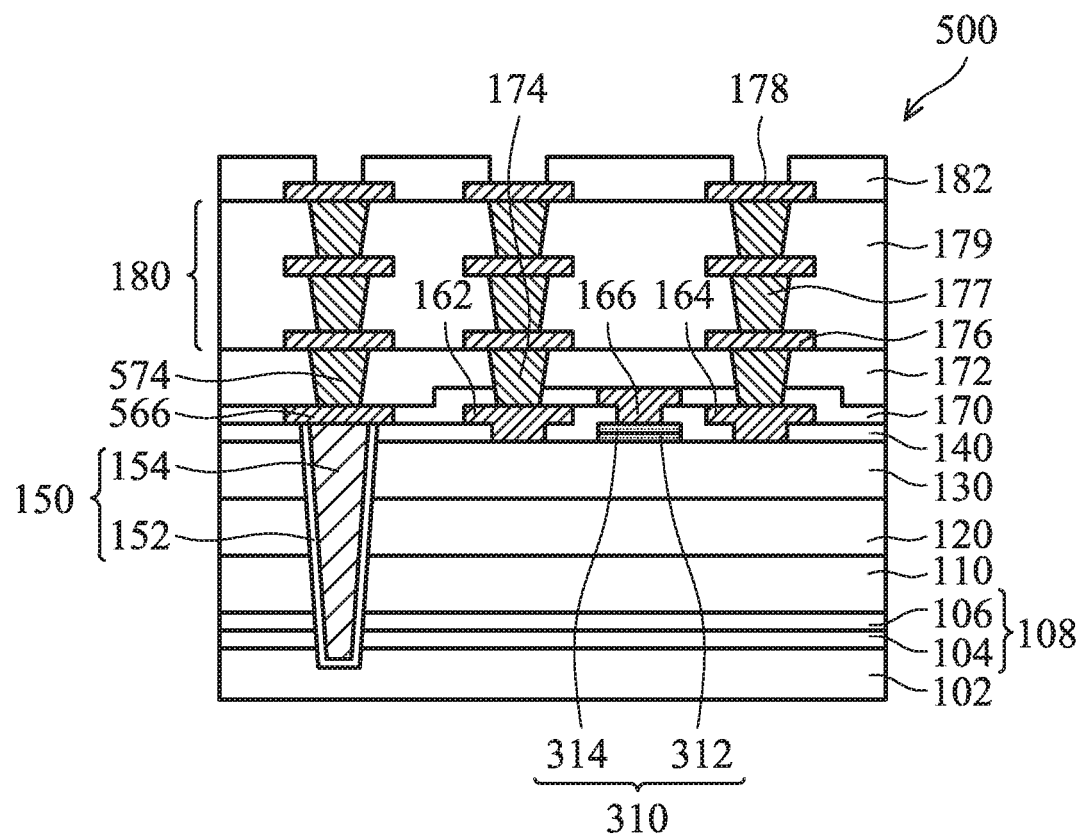
Figure 5F:
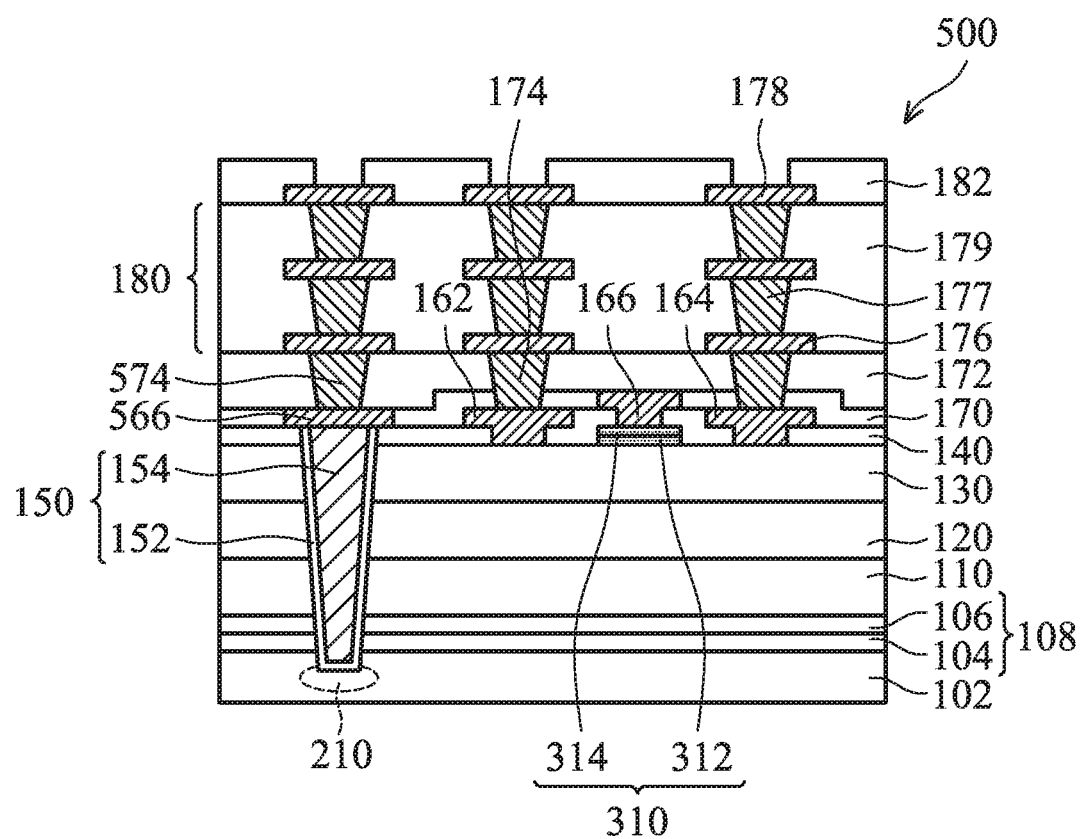

As shown in FIG. 5F, the interconnect structure 180 is formed over the third dielectric layer 172, in accordance with some embodiments of the disclosure.

FIG. 5F' shows a cross-sectional representation of a modified embodiment of the group III-V device structure 400. As shown in FIG. 5F', the doped well region 210 is formed under the trench 145 by the implant process. The doped well region 210 surrounds the through via structure 150.

FIGS. 6A-6E show cross-sectional representations of various stages of forming a group III-V device structure 600, in accordance with some embodiments of the disclosure.

Figure 6A:
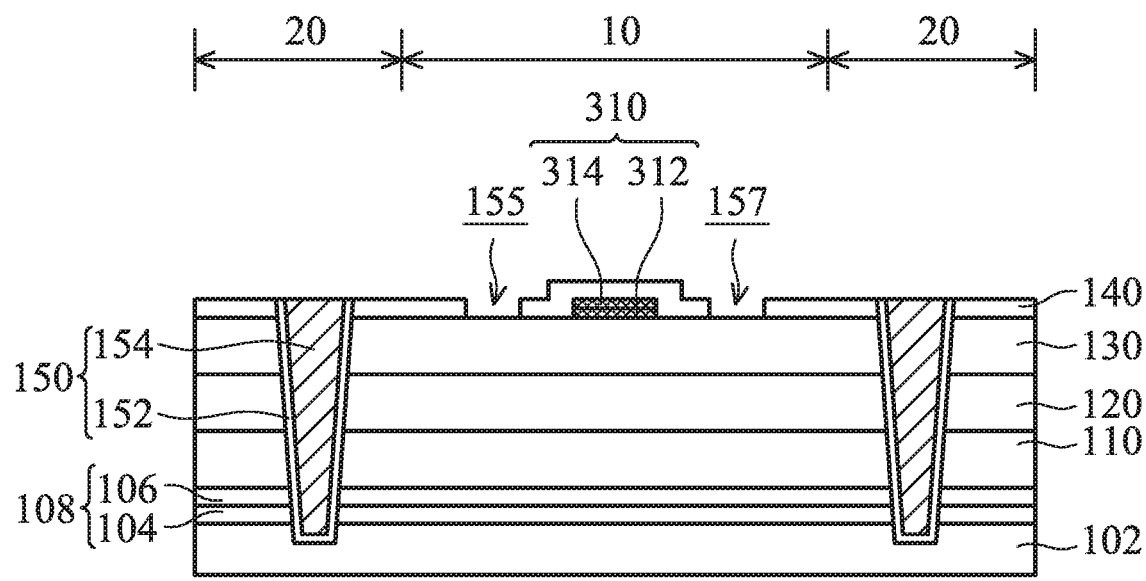
FIGS. 6A-6E show cross-sectional representations of various stages of forming a group III-V device structure, in accordance with some embodiments of the disclosure.

As shown in FIG. 6A, the substrate 102 includes a device region 10 and a peripheral region 20 surrounding the device region 10. The group III-V device structure is formed in the device region 10. The through via structure 150 is formed in the peripheral region 20. The peripheral region 20 is also a scribe line region. A number of the devices formed in the device region 10 of the substrate 102 (such as a silicon wafer) may be divided into smaller separated devices by cutting the substrate 102 along the scribe line in the scribe region. In some embodiments, the group III-V device structure 100, 200, 300 or 400 is formed in the device region 10.

Figure 6B:
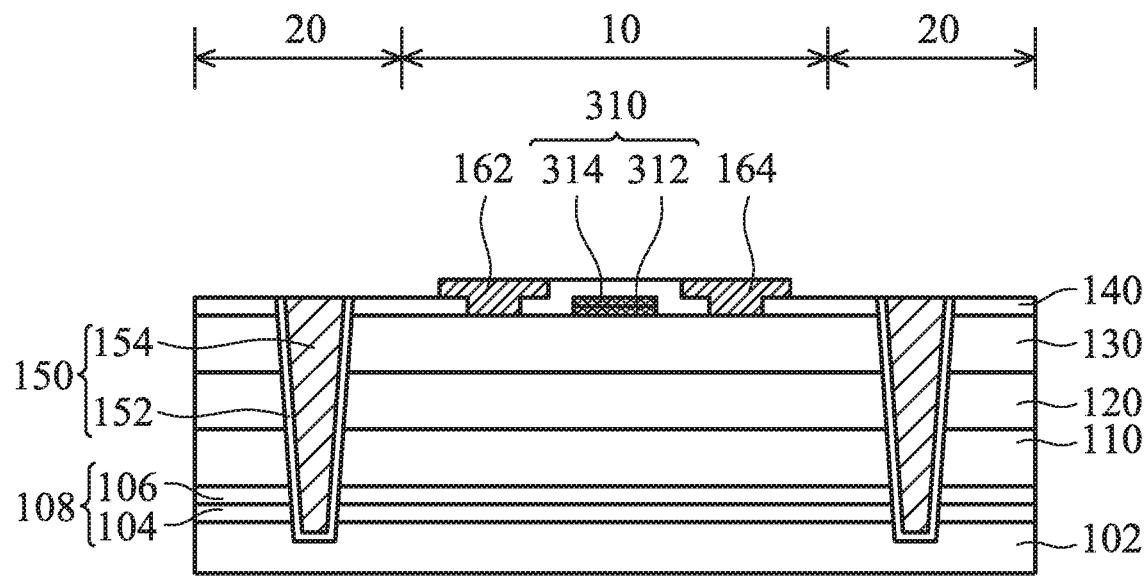

Next, as shown in FIG. 6B, the source electrode 162 is formed in the first opening 155 and on the first dielectric layer 140, and the drain electrode 164 is formed in the second opening 157, in accordance with some embodiments of the disclosure.

Figure 6C:
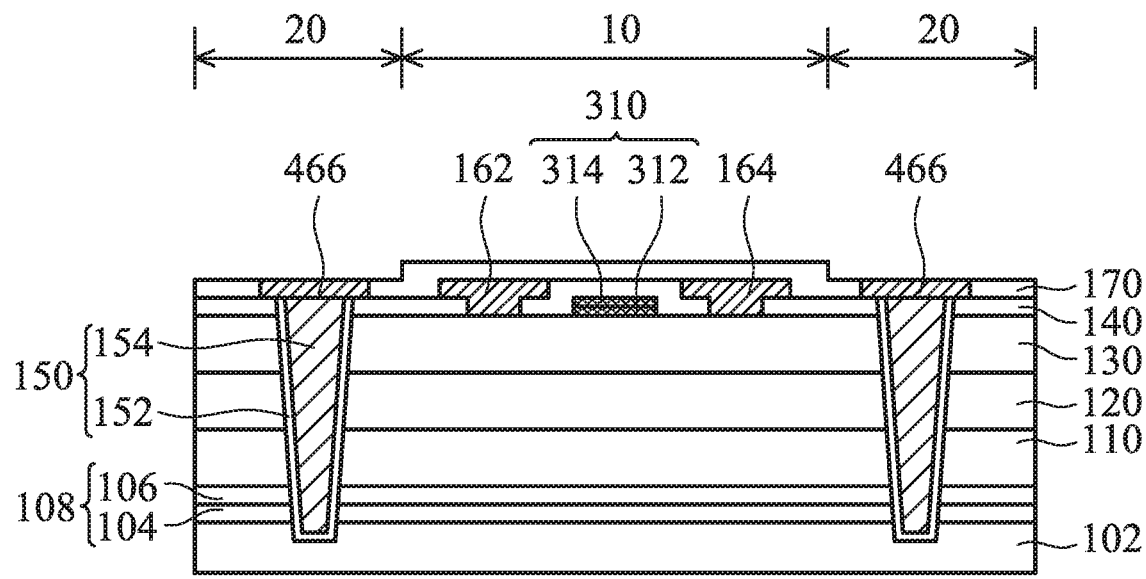

Afterwards, as shown in FIG. 6C, the second dielectric layer 170 is formed on the source electrode 162, the drain electrode 164, the first dielectric layer 140 and the through via structure 150, in accordance with some embodiments of the disclosure.

Figure 6D:
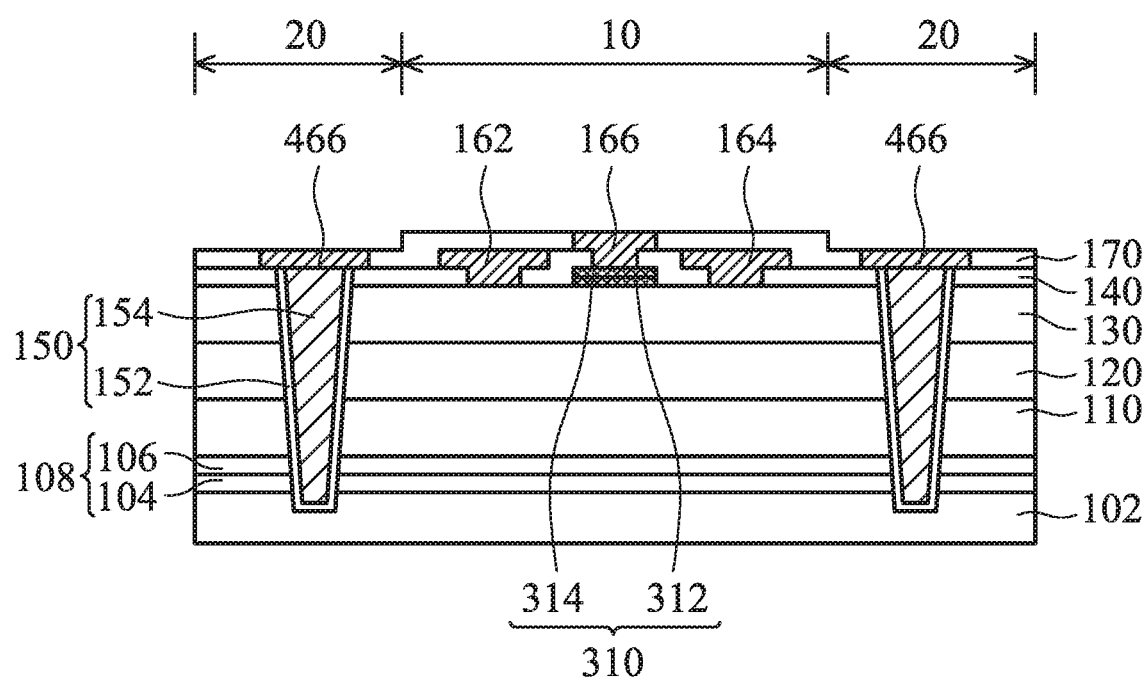

Next, as shown in FIG. 6D, the gate electrode 166 is formed through the second dielectric layer 170 and the first dielectric layer 140, in accordance with some embodiments of the disclosure. In addition, the conductive layer 566 is formed on and in direct contact with the through via structure 150. The gate electrode 166 is electrically connected to the NP structure 310.

Figure 6E:
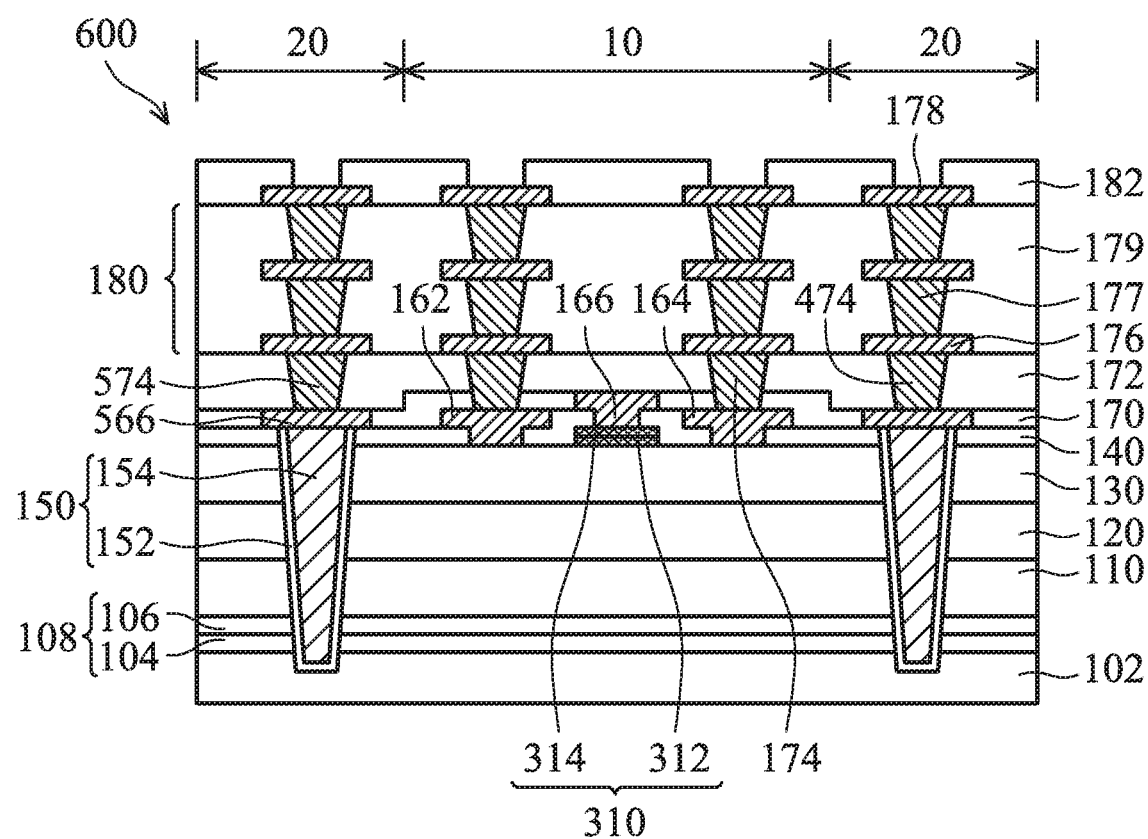

As shown in FIG. 6E, the contact structure 174 is formed on the source electrode 162 and the drain electrode 164, and the second contact structure 574 is formed on the conductive layer 566.

It should be noted that some cracks may form due to the stress difference when a cutting process is performed on the peripheral region 20 (or the scribe line region). The cracks originally start in the peripheral region 20 and may extend into the layers 110, 120, 130 in the device region 10, the devices in the device region 10 may degraded due to the extension. It should be noted that there is a lattice mismatch between the substrate 102 and the transistor structure 108. If some cracks are formed in the interface between the substrate 102 and the transistor structure 108 in e peripheral region 20, the cracks will extend into the interface between the substrate 102 and the transistor structure 108 in the device region 10 since the transistor structure 108 and the substrate 102 are continuous layers. In order to prevent cracking, the through via structure 150 is formed in the peripheral region 20 to function as a stopper or barrier. When the cutting process is performed, if cracks occur in the peripheral region 20, the through via structure 150 can stop the extension of the cracks.

FIGS. 7A-7E show top-view representations of a group III-V device structure, in accordance with some embodiments of the disclosure. FIG. 6A is a cross-sectional representation along line AA' of FIG. 7A, along line BB' of FIG. 7B, along line CC' of FIG. 7C, along line DD' of FIG. 7D, or along line EE' of FIG. 7E.

Figure 7A:
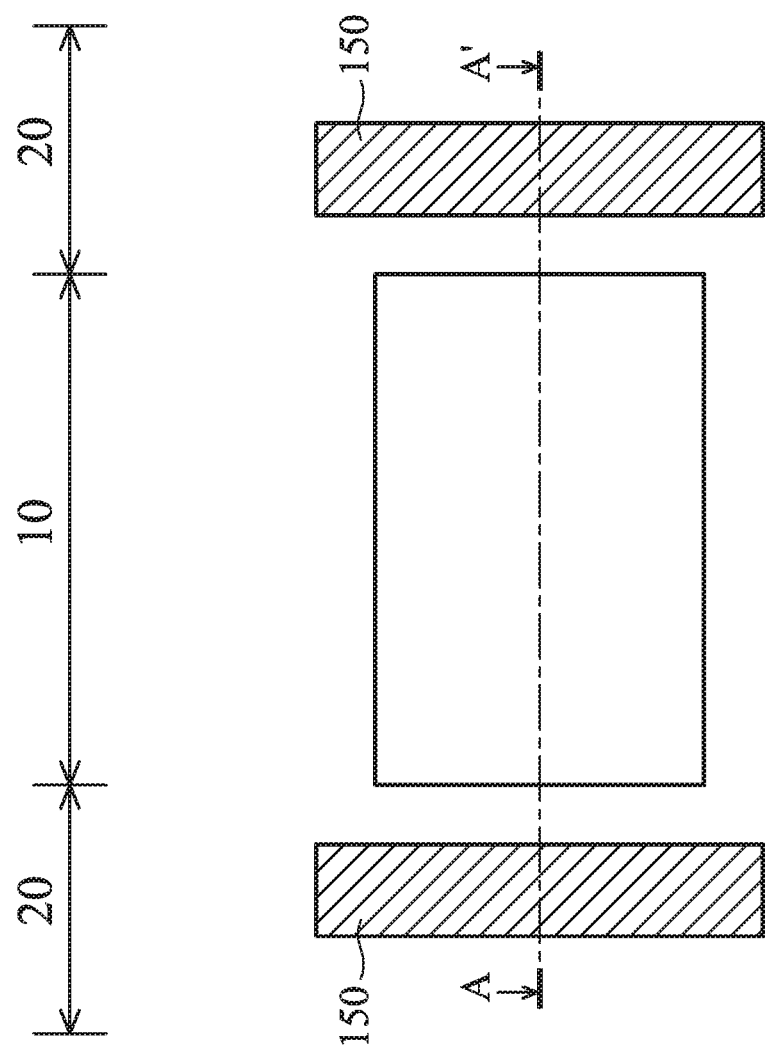
FIGS. 7A-7E show top-view representations of a group III-V device structure, in accordance with some embodiments of the disclosure.

As shown in FIG. 7A, the through via structure 150 includes two strip structures. The first strip structure is formed on the right side of the device region 10, and the second strip structure is formed on the left side of the device region 10.

Figure 7B:
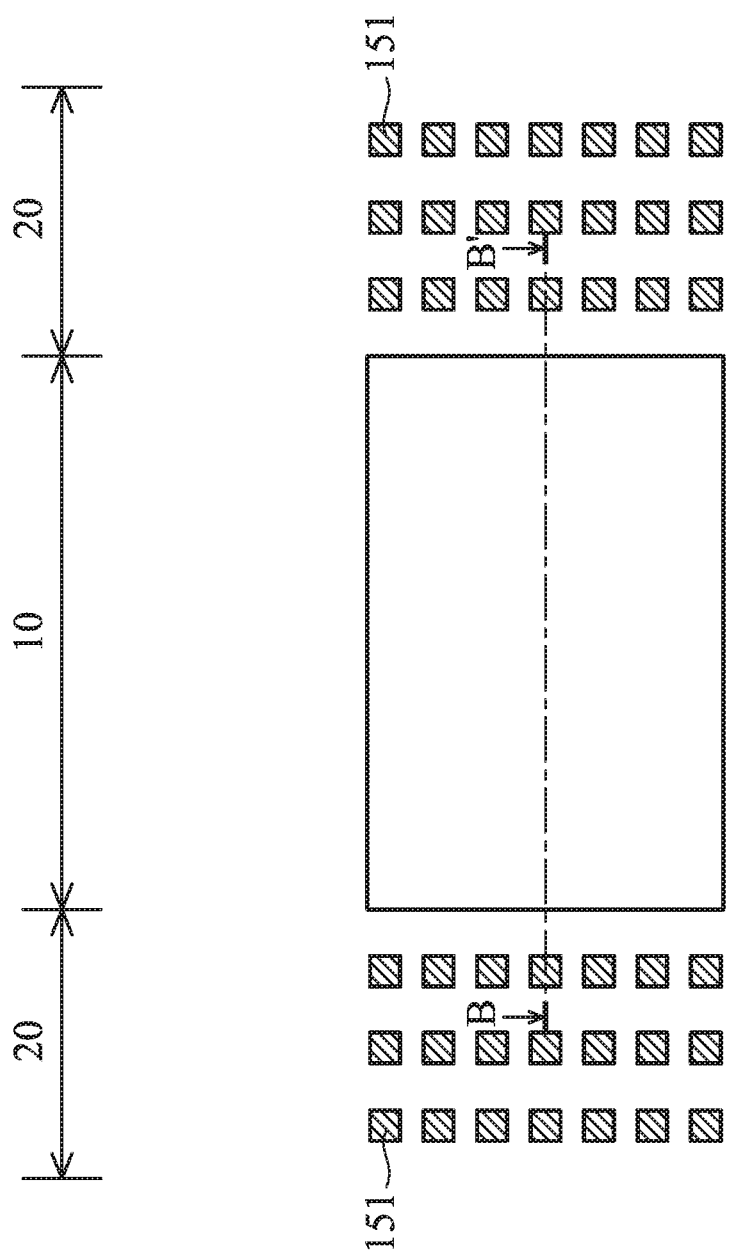

As shown in FIG. 7B, the through via structure 150 includes a number of vias 151. The vias 151 may be formed on the right side or the left side of the device region 10.

Figure 7C:
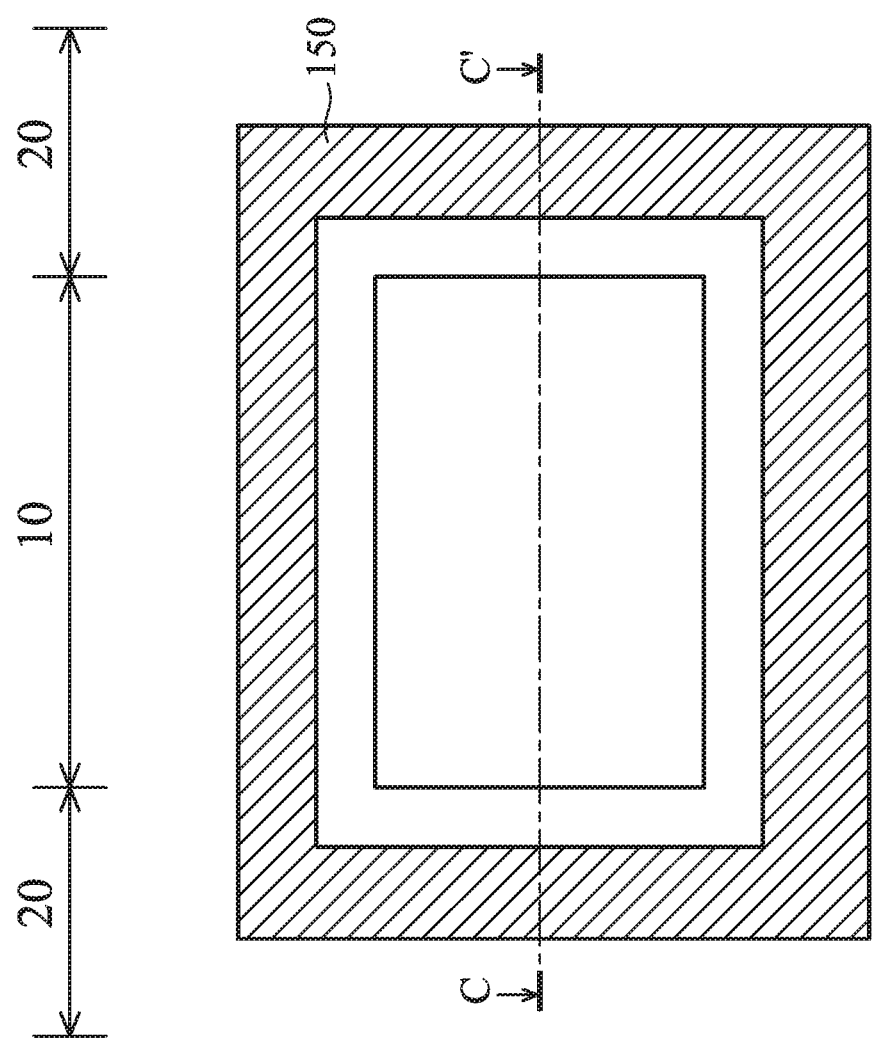

As shown in FIG. 7C, the through via structure 150 may be an enclosed ring structure. The device region 10 is entirely surrounded by the through via structure 150.

Figure 7D:
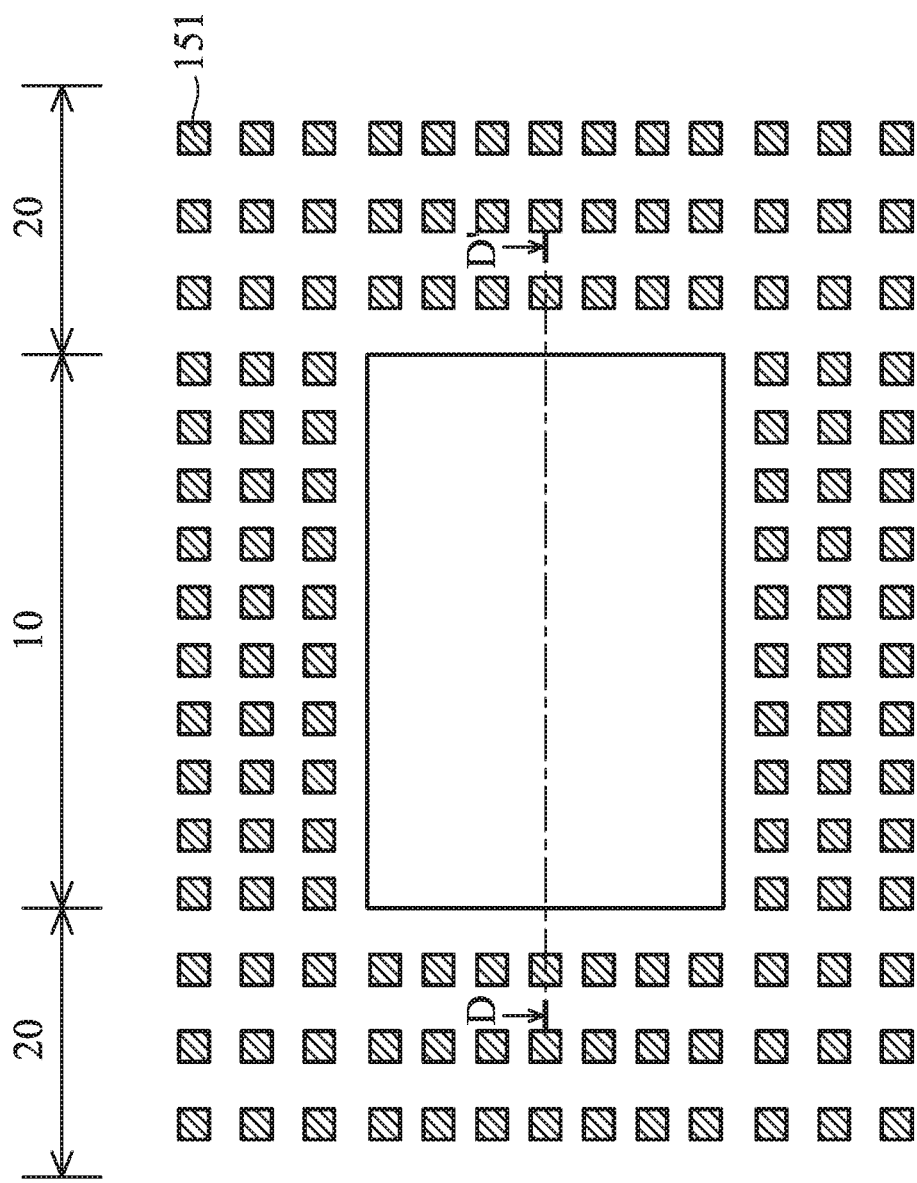

As shown in FIG. 7D, the through via structure 150 includes a number of vias 151. The vias 151 may construct multiple rings. In some embodiments, the vias 151 include a first ring, a second ring surrounding the first ring, and a third ring surrounding the second ring. Each of the first ring, the second ring, and the third ring may have a number of vias 151.

Figure 7E:
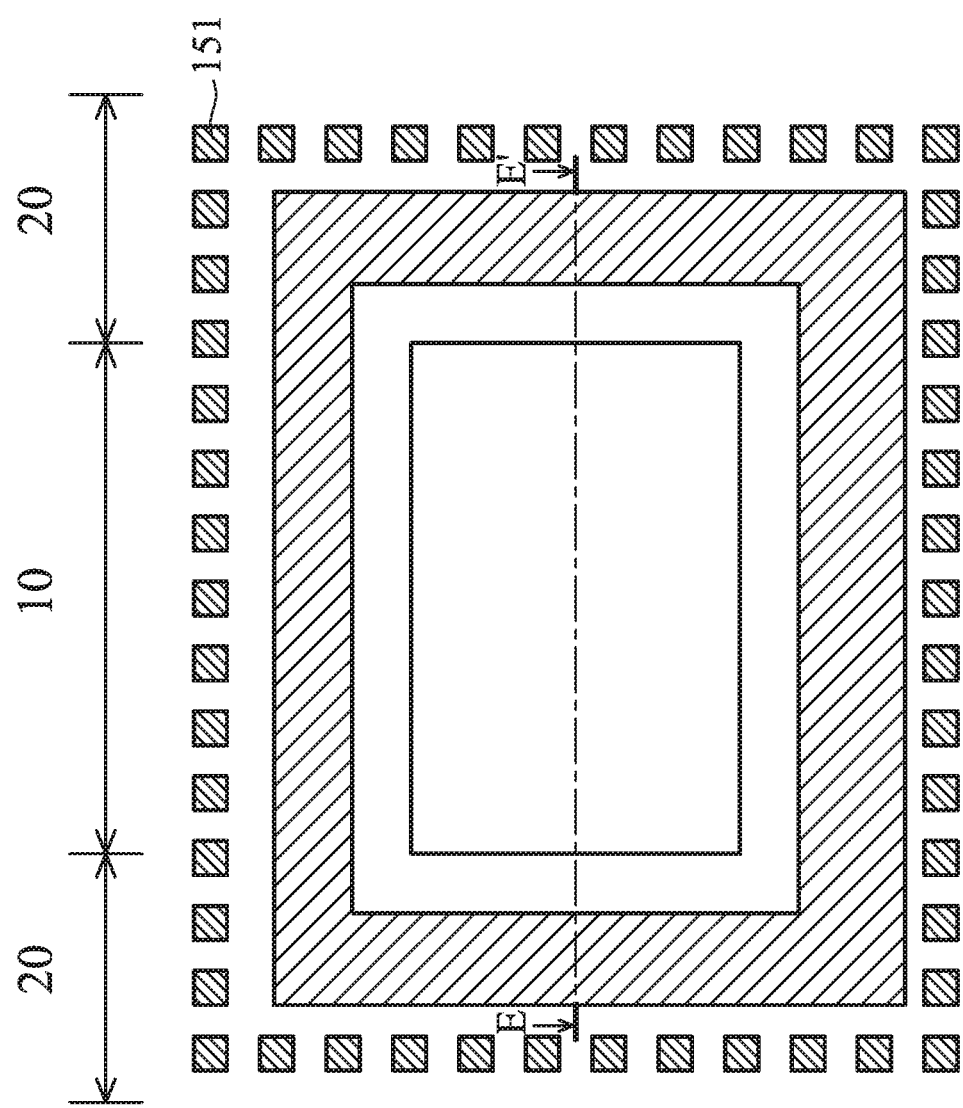

As shown in FIG. 7E, the through via structure 150 includes a ring and a number of vias surrounding the ring. The arrangements may be adjusted according to the application of the through via structure 150.

Embodiments for forming a group III-V device structure and method for formation of the same are provided. The group III-V device structure includes a source electrode or a drain electrode formed over the group III-V compound layers, and a through via structure is formed through the group III-V compound layers. The source electrode is electrically connected to the through via structure, and the source electrode is grounded. In some embodiments, the through via structure may be formed in the peripheral region to prevent cracking. In some other embodiments, the through via structure is connected to a conductive layer which is formed as the gate electrode is formed. The through via structure has multiple functions. The through via structure functions as a ground to eliminate background noise, as an NP structure, or as a barrier to prevent cracks from extending into the device region. Therefore, the performance of the group III-V device structure is improved.

In some embodiments, a group III-V device structure is provided. The group III-V device structure includes a channel layer formed over a substrate and an active layer formed over the channel layer. The group III-V device structure also includes a gate structure formed over the active layer and a source electrode and a drain electrode formed over the active layer. The source electrode and the drain electrode are formed on opposite sides of the gate structure. The group III-V device structure further includes a through via structure formed through the channel layer, the active layer and a portion of the substrate, and the through via structure is electrically connected to the source electrode or the drain electrode.

In some embodiments, a group III-V device structure is provided. The group III-V device structure includes a channel layer formed over a substrate and an active layer formed over the channel layer. The group III-V device structure also includes a first dielectric layer formed over the active layer and a gate structure formed over the first dielectric layer. The group III-V device structure further includes a through via structure extending from the first dielectric layer to a portion of the substrate and a conductive layer formed over the through via structure. A top surface of the gate structure is higher than the top surface of the conductive layer.

In some embodiments, a group III-V device structure is provided. The group III-V device structure includes a substrate including a device region and a peripheral region and a plurality of group III-V compound layers formed over the substrate. The group III-V device structure includes a group III-V device formed over the group III-V compound layers in the device region and a through a via structure formed through the group III-V compound layers in the peripheral region. The through via structure surrounds the group III-V device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions d alterations herein without departing from the spirit and scope of the present disclosure.

What is claimed is:

1. A group III-V device structure, comprising:
   a channel layer formed over a substrate;
   an active layer formed over the channel layer;
   a doped structure formed over the active layer;
   a first dielectric layer formed over the active layer and extends over the doped structure;
   a gate electrode formed over the doped structure, wherein the gate electrode has an extending portion over the first dielectric layer, and the first dielectric layer is between the extending portion of the gate electrode and the doped structure;
   a source electrode and a drain electrode formed over the active layer, wherein the source electrode and the drain electrode are formed on opposite sides of the gate electrode, and the doped structure is isolated from the source electrode by the first dielectric layer, wherein a bottom surface of the extending portion of the gate electrode is level with a top surface of the source electrode;
   a through via structure formed through the channel layer, the active layer and a portion of the substrate, wherein the source electrode horizontally extends over and in direct contact with the through via structure, and the first dielectric layer is between the active layer and the source electrode, and the through via structure is through the first dielectric layer; and
   a doped well region formed in a portion of the substrate and below the through via structure, wherein the doped well region surrounds a bottom portion of the through via structure.

2. The group III-V device structure as claimed in claim 1, wherein the doped structure comprises:
   a p-doped layer formed over the active layer; and
   an n-doped layer formed over the p-doped layer.

3. The group III-V device structure as claimed in claim 1, wherein the doped well region is doped with a first conductivity type, and the substrate is doped with a second conductivity type, and the first conductivity type is different from the second conductivity type.

4. The group III-V device structure as claimed in claim 1, further comprising:
 a transition layer over the substrate; and
 a buffer layer over the transition layer, wherein the buffer layer is formed between the transition layer and the channel layer.

5. The group III-V device structure as claimed in claim 1, further comprising:
 a contact structure formed on the through via structure, wherein the bottom surface of the extending portion of the gate electrode is level with a top surface of contact structure.

6. The group III-V device structure as claimed in claim 1, wherein the extending portion of the gate electrode is in direct contact with a topmost surface of the first dielectric layer.

7. The group III-V device structure as claimed in claim 1, further comprising:
 a second dielectric layer formed over the first dielectric layer, wherein a top surface of the second dielectric layer is leveled with a top surface of the gate electrode.

8. The group III-V device structure as claimed in claim 1, wherein the first dielectric layer has a step height.

9. The group III-V device structure as claimed in claim 1, further comprising:
 a contact structure formed on the source electrode, wherein the contact structure is electrically connected to the through via structure by the source electrode.

10. The group III-V device structure as claimed in claim 9, further comprising:
 an interconnect structure formed on the contact structure, wherein the interconnect structure comprises a metal layer, and the metal layer of the interconnect structure is electrically connected to the through via structure by the contact structure.

11. A group III-V device structure, comprising:
 a channel layer formed over a substrate;
 an active layer formed over the channel layer;
 a doped structure formed over the active layer;
 a first dielectric layer formed over the active layer and covering an edge of the doped structure;
 a gate electrode formed over the doped structure, wherein the first dielectric layer has a first portion, the first portion of the first dielectric layer covers the doped structure, and the gate electrode covers the first portion of the first dielectric layer;
 a through via structure extending from the first dielectric layer to a portion of the substrate;
 a conductive layer formed over the through via structure, wherein a top surface of the gate electrode is higher than a top surface of the conductive layer, wherein a top surface of the conductive layer is level with a top surface of the first portion of the first dielectric layer; and
 a doped well region formed in a portion of the substrate and below the through via structure, wherein the doped well region surrounds a bottom portion of the through via structure, the doped well region is doped with a first conductivity type, the substrate is doped with a second conductivity type, and the first conductivity type is different from the second conductivity type.

12. The group III-V device structure as claimed in claim 11, wherein the doped structure comprises:
 a p-doped layer formed over the active layer; and
 an n-doped layer formed over the p-doped layer.

13. The group III-V device structure as claimed in claim 11, further comprising:
 a transition layer over the substrate; and
 a buffer layer over the transition layer, wherein the buffer layer is between the transition layer and the channel layer.

14. The group III-V device structure as claimed in claim 11, further comprising:
 a source electrode and a drain electrode formed over the active layer, wherein the source electrode and the drain electrode are on opposite sides of the gate electrode, and a top surface of the source electrode is leveled with the top surface of the conductive layer.

15. The group III-V device structure as claimed in claim 14, further comprising:
 a first contact structure formed on the source electrode, wherein the first contact structure is electrically connected to the through via structure by the conductive layer.

16. The group III-V device structure as claimed in claim 14, further comprising:
 an interconnect structure formed on the first contact structure, wherein the interconnect structure comprises a first metal layer and a top metal layer; and
 a passivation layer formed over the interconnect structure, wherein the top metal layer is exposed by the passivation layer, and the first metal layer of the interconnect structure is electrically connected to the through via structure by the first contact structure.

17. A group III-V device structure, comprising:
 a channel layer formed over a substrate;
 an active layer formed over the channel layer;
 a p-doped layer formed over the active layer;
 a n-doped layer formed over the p-doped layer;
 a first dielectric layer formed over the active layer;
 a gate electrode formed over the n-doped layer, wherein the gate electrode is in direct contact with the n-doped layer;
 a source electrode formed adjacent to the gate electrode, wherein the source electrode has an extending portion, and the extending portion of the source electrode covers a top surface of the first dielectric layer, and a top surface of the source electrode is level with a top surface of the first dielectric layer;
 a through via structure formed in the substrate, wherein the extending portion of the source electrode extends over the through via structure, and
 a doped well region formed in a portion of the substrate and below the through via structure, wherein the doped well region surrounds a bottom portion of the through via structure.

18. The group III-V device structure as claimed in claim 17, wherein the first dielectric layer has a first portion, the first portion of the first dielectric layer covers the n-doped layer, and the gate electrode covers the first portion of the first dielectric layer.

19. The group III-V device structure as claimed in claim 17, wherein a bottom surface of the extending portion of the source electrode is substantially level with a top surface of the n-doped layer.

* * * * *